(12) United States Patent
Kido et al.

(10) Patent No.: US 8,828,525 B2
(45) Date of Patent: Sep. 9, 2014

(54) FLEXIBLE PRINTED CIRCUIT BOARD INTEGRATED WITH REINFORCING PLATE, AND METHOD FOR MANUFACTURING FLEXIBLE PRINTED CIRCUIT BOARD INTEGRATED WITH REINFORCING PLATE

(75) Inventors: Masayoshi Kido, Otsu (JP); Tetsuya Kogiso, Otsu (JP); Yoshihide Sekito, Otsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 13/822,424

(22) PCT Filed: Jul. 8, 2011

(86) PCT No.: PCT/JP2011/065726
§ 371 (c)(1),
(2), (4) Date: Mar. 12, 2013

(87) PCT Pub. No.: WO2012/035857
PCT Pub. Date: Mar. 22, 2012

(65) Prior Publication Data
US 2013/0183499 A1    Jul. 18, 2013

(30) Foreign Application Priority Data
Sep. 13, 2010 (JP) .................. 2010-204494
Sep. 29, 2010 (JP) .................. 2010-219687

(51) Int. Cl.
*B32B 3/00* (2006.01)
*H05K 3/00* (2006.01)
*C09J 163/00* (2006.01)
*H05K 1/02* (2006.01)
*H05K 1/18* (2006.01)

(52) U.S. Cl.
CPC .............. *H05K 3/0058* (2013.01); *H05K 1/189* (2013.01); *C09J 163/00* (2013.01); *H05K 1/0271* (2013.01)
USPC ......................................................... 428/209

(58) Field of Classification Search
CPC ............... H05K 1/03; H05K 3/00; B32B 3/00
USPC ......................................................... 428/209
See application file for complete search history.

(56) References Cited

U.S. PATENT DOCUMENTS 7,790,354 B2 * 9/2010 Ishigaki et al. .......... 430/280.1

FOREIGN PATENT DOCUMENTS

| JP | 2004-319660 A | 11/2004 |
| JP | 2006-202849 A | 8/2006 |

(Continued)

OTHER PUBLICATIONS

International Search Report for PCT/JP2011/065726 dated Sep. 27, 2011.

(Continued)

*Primary Examiner* — Elizabeth Mulvaney
(74) *Attorney, Agent, or Firm* — Sughrue Mion, PLLC

(57) ABSTRACT

An object of the present invention is to provide (i) a stiffener-integrated flexible printed circuit board in which a defect such as a blistering is not generated during a reflow process even though a stiffener is attached to a photosensitive resin composition, and (ii) a method for manufacturing the stiffener-integrated flexible printed circuit board. The object can be attained by causing a stiffener-integrated flexible printed circuit board to have a structure in which (A) a stiffener (6), (B) a bonding material (5), (C) a cured film obtained by curing a photosensitive resin composition (4), and (D) a flexible printed circuit board (1) are laminated in this order.

25 Claims, 2 Drawing Sheets

(56) References Cited

FOREIGN PATENT DOCUMENTS

| | | | |
|---|---|---|---|
| JP | 2006-348131 | A | 12/2006 |
| JP | 2007-27374 | A | 2/2007 |
| JP | 2007-73738 | A | 3/2007 |
| JP | 2007-304543 | A | 11/2007 |
| JP | 2009-86414 | A | 4/2009 |
| JP | 2009-200292 | A | 9/2009 |
| JP | 2010-32743 | A | 2/2010 |
| JP | 2010-108964 | A | 5/2010 |
| JP | 2010-144141 | A | 7/2010 |

OTHER PUBLICATIONS

English Translation of the International Preliminary Report on Patentability (Chapter I) of PCT Application No. PCT/JP2011/065726. dated Apr. 18, 2013.

* cited by examiner

FLEXIBLE PRINTED CIRCUIT BOARD INTEGRATED WITH REINFORCING PLATE, AND METHOD FOR MANUFACTURING FLEXIBLE PRINTED CIRCUIT BOARD INTEGRATED WITH REINFORCING PLATE

CROSS REFERENCE TO RELATED APPLICATIONS

This application is a National Stage of International Application No. PCT/JP2011/065726 filed Jul. 8, 2011, claiming priority based on Japanese Patent Application Nos. 2010-204494 filed Sep. 13, 2010 and 2010-219687 filed Sep. 29, 2010, the contents of all of which are incorporated herein by reference in their entirety.

TECHNICAL FIELD

The present invention relates to a stiffener-integrated flexible printed circuit board in which a defect such as a blistering is not generated during a reflow process even though a stiffener is attached to a photosensitive resin composition, and to a method for manufacturing such a stiffener-integrated flexible printed circuit board.

BACKGROUND ART

Conventionally, various substrate protecting means have been generally used in production of printed wiring boards. For example, a resist is used in an etching process, and a solder resist is used during a soldering process. Also in production of a film printed wiring board (hereinafter abbreviated as "flexible printed circuit board") which is mounted in, for example, a small-sized device, in a soldering process for component mounting, a solder resist is used to protect wiring which is independent of the soldering process. Specifically, a cover lay film or a cover coat has been used as the substrate protecting means such as a resist, a solder resist, or the like. The cover lay film is formed by punching out a polyimide film in a given shape and is then laminated on a flexible printed circuit board. The cover coat is formed by printing, on a flexible printed circuit board, ink which is made of a heat resistant material. The cover lay film or the cover coat, which serves also as a protective film for wiring after soldering, is required to have not only UL-approved flame retardancy but also bleedout resistance, plasticity, adhesiveness, bending resistance and flexibility such that the cover lay film or the cover coat is not cracked while being bent during incorporation, into any device, of the flexible printed circuit board on which the cover lay film or the cover coat is laminated, heat resistance during soldering, moisture resistance, and insulation properties.

A cover lay film is formed by punching out a polyimide film and is then laminated on a flexible printed circuit board. The cover lay film satisfies the above required characteristics and is currently most widely used. Meanwhile, such a cover lay film has the following problems: (i) costs for producing the flexible printed circuit board increase due to (a) an expensive mold necessary for punching and (b) manual positioning and combining of a punched-out film; and (ii) formation of a micropattern is difficult.

As a method for solving the above problems, a method has been proposed in which a liquid photosensitive resin composition or a film photosensitive resin composition is applied to a substrate. According to the method, a micropattern can be easily formed in a case where exposure, development, and heating are carried out by a photographic technique after a photosensitive resin composition film is formed on the substrate. Therefore, various photosensitive resin compositions have been developed.

For example, Patent Literature 1 has proposed an alkali-developable photosensitive thermosetting resin composition which contains no halogen, has high-level flame retardancy, and is capable of forming a film that has a low warping property after curing and is excellent in plasticity, resolution, resistance to heat of soldering, chemical resistance and the like, the alkali-developable photosensitive thermosetting resin composition containing (i) a resin component which has a (meth)acryloyl group and a carboxyl group within a molecule and is soluble in a dilute alkali solution, (ii) an epoxy compound having two or more epoxy groups per molecule, (iii) a photopolymerization initiator, (iv) an organic phosphorus compound, (v) a diluent, and (vi) a polyimide resin having a predetermined structure. Meanwhile, Patent Literature 2 has proposed a photosensitive thermosetting resin composition which sufficiently satisfies flexibility and is also sufficiently excellent in flame retardancy and hot pressing resistance, the photosensitive thermosetting resin composition containing (i) a polymer having a carboxyl group, (ii) a photopolymerizable compound having an ethylenically unsaturated bond and containing no halogen atom, (iii) a photopolymerization initiator, (iv) a phenoxyphosphazene compound, (v) a phosphoric ester compound, and (vi) a halogen-based flame retardant.

A flexible printed circuit board is a wiring board having a thickness of several tens of μm to several hundreds of μm. Therefore, in case of component mounting, a stiffener having a thickness of 0.5 mm to 2.0 mm may be partially attached to a base material surface (see Patent Literature 3) or a non-photosensitive cover lay film surface (see Patent Literature 4) of a flexible printed circuit board so that a supporting property of a mounting part is secured. (a) of FIG. 3 is a schematic view of a stiffener-integrated flexible printed circuit board described in Patent Literature 3. (b) of FIG. 3 is a schematic view of a stiffener-integrated flexible printed circuit board described in Patent Literature 4. According to the stiffener-integrated flexible printed circuit board of Patent Literature 3, a stiffener (6), a bonding material (5), a flexible printed circuit board (1), and a non-photosensitive cover lay film (4') are laminated in this order (see (a) of FIG. 3). According to the stiffener-integrated flexible printed circuit board of Patent Literature 4, a flexible printed circuit board (1), a non-photosensitive cover lay film (4'), a bonding material (5'), and a stiffener (6) are laminated in this order (see (b) of FIG. 3).

CITATION LIST

Patent Literature 1
Japanese Patent Application Publication, Tokukai, No. 2010-032743 A (Publication Date: Feb. 12, 2010)
Patent Literature 2
Japanese Patent Application Publication, Tokukai, No. 2007-304543 A (Publication Date: Nov. 22, 2007)
Patent Literature 3
Japanese Patent Application Publication, Tokukai, No. 2010-144141 A (Publication Date: Jul. 1, 2010)
Patent Literature 4
Japanese Patent Application Publication, Tokukai, No. 2007-027374 A (Publication Date: Feb. 1, 2007)

SUMMARY OF INVENTION

Technical Problem

Meanwhile, in order to secure a supporting property of a mounting part of a flexible printed circuit board, it may also be possible to attach a stiffener to a photosensitive cover lay film. However, in this case, which is different from a case where a stiffener is attached to a non-photosensitive cover lay film, it is extremely difficult to improve adhesiveness between the stiffener and the photosensitive cover lay film while balancing the adhesiveness and the other characteristics (e.g., photosensitivity) of the photosensitive cover lay film which is required to be multi-functional.

Actually, in a case where a stiffener is attached to the photosensitive thermosetting resin composition of Patent Literature 1 by use of a thermosetting adhesive, a problem of, for example, generation of a blistering during a reflow process (hereinafter this problem is referred to as "a problem of reflow heat resistance") occurs since the thermosetting adhesive which is used to attach the stiffener to the photosensitive thermosetting resin composition and the photosensitive thermosetting resin composition are insufficiently adhered to each other in the reflow process, which is carried out for component mounting after attaching the stiffener to the photosensitive thermosetting resin composition. As in the case of Patent Literature 1, according to Patent Literature 2, it is feared that sufficient reflow heat resistance may not be obtained while hot pressing resistance is obtained.

Note that inventors of the present invention uniquely found an idea of attaching a stiffener to a photosensitive resin composition and that a person skilled in the art had not carried out a technique of attaching a stiffener to a photosensitive resin composition. Therefore, an object of the present invention is a novel object found by a person skilled in the art.

Solution to Problem

The inventors of the present invention diligently carried out research so as to attain the object, and finally succeeded in finding an arrangement in which even a stiffener-integrated flexible printed circuit board having a structure in which (A) a stiffener, (B) a bonding material, (C) a cured film obtained by curing a photosensitive resin composition, and (D) a flexible printed circuit board are laminated in this order, or a stiffener-integrated flexible printed circuit board having a structure in which (A) a stiffener, (C) a cured film obtained by curing a photosensitive resin composition, and (D) a flexible printed circuit board are laminated in this order allows securement of sufficient reflow heat resistance.

In order to attain the object, a method in accordance with the present invention for manufacturing a stiffener-integrated flexible printed circuit board, includes the step of: laminating (B) a bonding material and (A) a stiffener in this order on (C) a photosensitive resin composition cured film obtained by applying a photosensitive resin composition to (D) a flexible printed circuit board and curing the photosensitive resin composition. A method in accordance with the present invention for manufacturing a stiffener-integrated flexible printed circuit board may be arranged to include the step of: laminating (A) a stiffener on (C) a photosensitive resin composition cured film obtained by applying a photosensitive resin composition to (D) a flexible printed circuit board and curing the photosensitive resin composition.

Note that according to the stiffener-integrated flexible printed circuit board of Patent Literature 3, the stiffener (6), the bonding material (5), the flexible printed circuit board (1), and the non-photosensitive cover lay film (4') are laminated in this order (see (a) of FIG. 3). Therefore, the stiffener-integrated flexible printed circuit board of Patent Literature 3 is different from a stiffener-integrated flexible printed circuit board in accordance with the present invention in that the stiffener is provided on the flexible printed circuit board side.

Meanwhile, according to the stiffener-integrated flexible printed circuit board of Patent Literature 4, the flexible printed circuit board (1), the non-photosensitive cover lay film (4'), the bonding material (5'), and the stiffener (6) are laminated in this order (see (b) of FIG. 3). Therefore, the stiffener-integrated flexible printed circuit board of Patent Literature 4 is identical to a stiffener-integrated flexible printed circuit board in accordance with the present invention in that the stiffener is provided on the cover lay film. However, the stiffener-integrated flexible printed circuit board of Patent Literature 4 is different from the stiffener-integrated flexible printed circuit board in accordance with the present invention in that the cover lay film is a non-photosensitive cover lay film.

Advantageous Effects of Invention

As described earlier, the present invention, which is a stiffener-integrated flexible printed circuit board having a structure in which (A) a stiffener, (B) a bonding material, (C) a cured film obtained by curing a photosensitive resin composition, and (D) a flexible printed circuit board are laminated in this order, or a stiffener-integrated flexible printed circuit board having a structure in which (A) a stiffener, (C) a cured film obtained by curing a photosensitive resin composition, and (D) a flexible printed circuit board are laminated in this order, yields an effect such that a defect such as a blistering is not generated during a reflow process even though a stiffener is attached to a photosensitive resin composition.

BRIEF DESCRIPTION OF DRAWINGS

FIG. 1 shows an example of a stiffener-integrated flexible printed circuit board in accordance with the present invention and a process for manufacturing the stiffener-integrated flexible printed circuit board.

FIG. 2 schematically shows how a warpage amount of a film is measured.

FIG. 3 schematically shows an arrangement of a stiffener-integrated flexible printed circuit board which has been conventionally publicly known.

DESCRIPTION OF EMBODIMENTS

Figure 1:
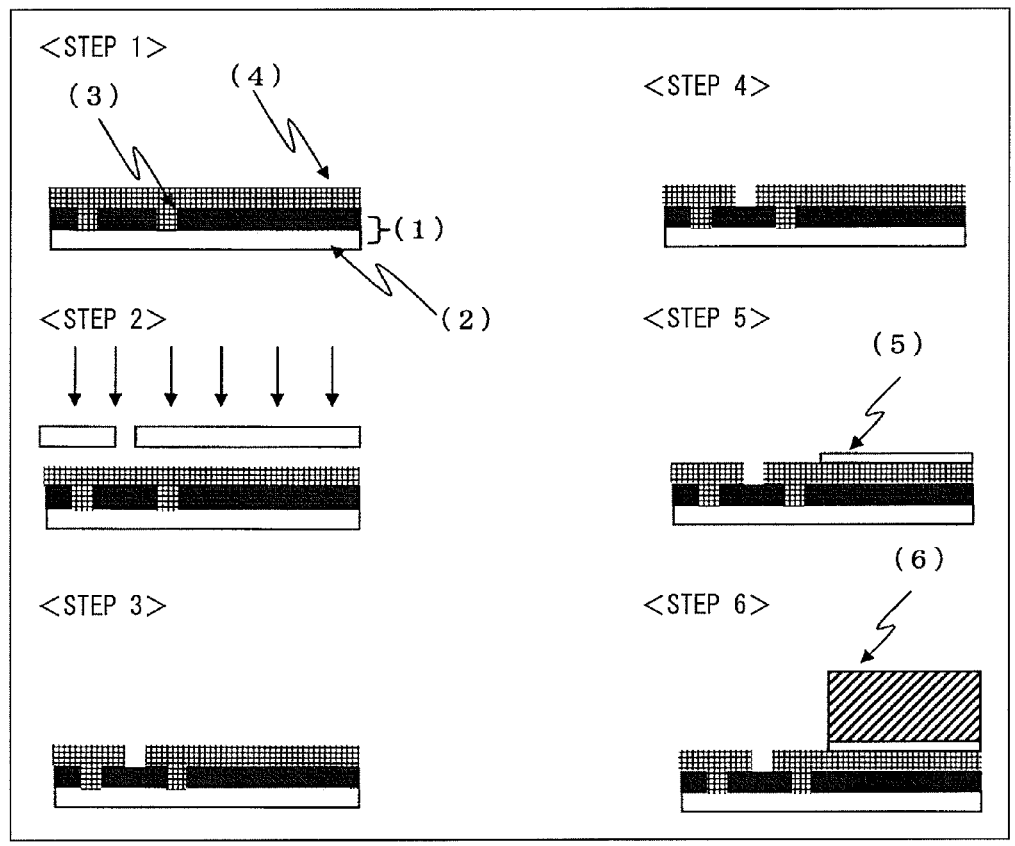
FIG. 1

In order to attain the object, a stiffener-integrated flexible printed circuit board in accordance with the present invention has a structure in which (A) a stiffener, (B) a bonding material, (C) a cured film obtained by curing a photosensitive resin composition, and (D) a flexible printed circuit board are laminated in this order.

The stiffener-integrated flexible printed circuit board in accordance with the present invention may be arranged such that the stiffener-integrated flexible printed circuit board has a peel strength of not less than 1N/cm between (B) the bonding material and (C) the cured film obtained by curing a photosensitive resin composition.

The stiffener-integrated flexible printed circuit board in accordance with the present invention may be arranged such that (B) the bonding material is a thermosetting adhesive.

In order to attain the object, a stiffener-integrated flexible printed circuit board in accordance with the present invention has a structure in which (A) a stiffener, (C) a cured film obtained by curing a photosensitive resin composition, and (D) a flexible printed circuit board are laminated in this order.

The stiffener-integrated flexible printed circuit board in accordance with the present invention may be arranged such that the photosensitive resin composition contains (E) a thermosetting resin containing a reactive group reactive with a carboxyl group and (F) a carboxyl group-containing resin.

The stiffener-integrated flexible printed circuit board in accordance with the present invention may be arranged such that (E) the thermosetting resin containing a reactive group reactive with a carboxyl group is an epoxy resin containing an epoxy group as the reactive group.

The stiffener-integrated flexible printed circuit board in accordance with the present invention may be arranged such that (F) the carboxyl group-containing resin is a carboxyl group-containing resin which contains substantially no photosensitive group in its molecule.

The stiffener-integrated flexible printed circuit board in accordance with the present invention may be arranged such that the reactive group in (E) the thermosetting resin containing a reactive group reactive with a carboxyl group is 1.0 time to 1.8 times greater in mole than a carboxyl group of (F) the carboxyl group-containing resin.

The stiffener-integrated flexible printed circuit board in accordance with the present invention may be arranged such that the reactive group in (E) the thermosetting resin containing a reactive group reactive with a carboxyl group is 1.0 time to 1.8 times greater in mole than a carboxyl group of (F) the carboxyl group-containing resin.

The stiffener-integrated flexible printed circuit board in accordance with the present invention may be arranged such that the photosensitive resin composition contains (G) an unsaturated double bond-containing resin and (H) a photopolymerization initiator.

The stiffener-integrated flexible printed circuit board in accordance with the present invention may be arranged such that the photosensitive resin composition contains at least (I) a compound which contains a urethane bond(s).

The stiffener-integrated flexible printed circuit board in accordance with the present invention may be arranged such that the photosensitive resin composition contains (i1) a resin which contains no unsaturated double bond in its molecule and contains a urethane bond(s) in its molecule.

The stiffener-integrated flexible printed circuit board in accordance with the present invention may be arranged such that the photosensitive resin composition contains (i2) a resin which contains an unsaturated double bond(s) in its molecule and contains a urethane bond(s) in its molecule.

The stiffener-integrated flexible printed circuit board in accordance with the present invention may be arranged such that the photosensitive resin composition contains (i1) a resin which contains no unsaturated double bond in its molecule and contains a urethane bond(s) in its molecule and (i2) a resin which contains an unsaturated double bond(s) in its molecule and contains a urethane bond(s) in its molecule.

The stiffener-integrated flexible printed circuit board in accordance with the present invention may be arranged such that the photosensitive resin composition further contains (H) a photopolymerization initiator.

In order to attain the object, the present invention encompasses a method for manufacturing a stiffener-integrated flexible printed circuit board, including the step of: laminating (B) a bonding material and (A) a stiffener in this order on (C) a photosensitive resin composition cured film obtained by applying a photosensitive resin composition to (D) a flexible printed circuit board and curing the photosensitive resin composition. A method in accordance with the present invention for manufacturing a stiffener-integrated flexible printed circuit board may be arranged to include the step of: laminating (A) a stiffener on (C) a photosensitive resin composition cured film obtained by applying a photosensitive resin composition to (D) a flexible printed circuit board and curing the photosensitive resin composition.

The method in accordance with the present invention may be arranged such that (B) the bonding material is a thermosetting adhesive.

The method in accordance with the present invention may be arranged such that the photosensitive resin composition contains (E) a thermosetting resin containing a reactive group reactive with a carboxyl group and (F) a carboxyl group-containing resin.

The method in accordance with the present invention may be arranged such that (E) the thermosetting resin containing a reactive group reactive with a carboxyl group is an epoxy resin containing an epoxy group as the reactive group.

The method in accordance with the present invention may be arranged such that (F) the carboxyl group-containing resin is a carboxyl group-containing resin which contains substantially no photosensitive group in its molecule.

The method in accordance with the present invention may be arranged such that the reactive group in (E) the thermosetting resin containing a reactive group reactive with a carboxyl group is 1.0 time to 1.8 times greater in mole than a carboxyl group of (F) the carboxyl group-containing resin.

The method in accordance with the present invention may be arranged such that the photosensitive resin composition contains (G) an unsaturated double bond-containing resin and (H) a photopolymerization initiator.

The method in accordance with the present invention may be arranged such that the photosensitive resin composition contains at least (I) a compound which contains a urethane bond(s).

The method in accordance with the present invention may be arranged such that the photosensitive resin composition contains (i1) a resin which contains no unsaturated double bond in its molecule and contains a urethane bond(s) in its molecule.

The method in accordance with the present invention may be arranged such that the photosensitive resin composition contains (i2) a resin which contains an unsaturated double bond(s) in its molecule and contains a urethane bond(s) in its molecule.

The method in accordance with the present invention may be arranged such that the photosensitive resin composition contains (i1) a resin which contains no unsaturated double bond in its molecule and contains a urethane bond(s) in its molecule and (i2) a resin which contains an unsaturated double bond(s) in its molecule and contains a urethane bond(s) in its molecule.

The method in accordance with the present invention may be arranged such that the photosensitive resin composition further contains (H) a photopolymerization initiator.

The following description more specifically discusses an embodiment of the present invention.

A stiffener-integrated flexible printed circuit board in accordance with the present invention is a stiffener-integrated flexible printed circuit board having a structure in which (A) a stiffener, (B) a bonding material, (C) a cured film obtained by curing a photosensitive resin composition, and (D) a flexible printed circuit board are laminated in this order, or a stiffener-integrated flexible printed circuit board having a structure in which (A) a stiffener, (C) a cured film obtained by curing a photosensitive resin composition, and (D) a flexible printed circuit board are laminated in this order.

A technique for reinforcing a flexible printed circuit board for reinforcement during component mounting may be exemplified by combining of a stiffener with a base material surface or a non-photosensitive cover lay film surface of the flexible printed circuit board. Alternatively, the stiffener may be combined with a photosensitive cover lay film surface of the flexible printed circuit board. In view of this, in a case where a stiffener is combined with a surface of a photosensitive resin composition via a thermosetting adhesive, deterioration in reflow heat resistance is shown during a reflow process since the thermosetting adhesive and the photosensitive resin composition are insufficiently adhered to each other.

The following description discusses a stiffener-integrated flexible printed circuit board of the present invention and a method of the present invention for manufacturing a stiffener-integrated flexible printed circuit board. The following description also discusses (A) a stiffener, (B) a bonding material, (C) a cured film obtained by curing a photosensitive resin composition, (D) a flexible printed circuit board, and other components.

[Stiffener-Integrated Flexible Printed Circuit Board]

FIG. 1 shows an arrangement of a stiffener-integrated flexible printed circuit board of the present invention and a method for manufacturing the stiffener-integrated flexible printed circuit board. However, the present invention is not limited to this. (D) A flexible printed circuit board (1) which is constituted by a base material (2) and a conductor (3) is coated with a photosensitive resin composition <step 1>, and (C) a cured film of the photosensitive resin composition (may be simply referred to as "a photosensitive resin composition cured film") (4) is prepared via exposure <step 2>, development <step 3>, and curing <step 4>. Thereafter, a stiffener-integrated flexible printed circuit board is prepared by combining (A) a stiffener (6) with a surface of (C) the photosensitive resin composition cured film (4) and carrying out heat and pressure molding.

In this case, if a thermosetting adhesive is used as (B) a bonding material (5), (B) the bonding material (thermosetting adhesive) (5) is temporarily pressure-bonded to the surface of (C) the photosensitive resin composition cured film (4) <step 5>. In this case, (B) the bonding material (thermosetting adhesive) (5) is in a semi-cured state. Thereafter, the stiffener-integrated flexible printed circuit board is prepared by combining (A) the stiffener (6) with a surface of (B) the bonding material (thermosetting adhesive) (5) and carrying out the heat and pressure molding <step 6>. At the step 6, (B) the bonding material (thermosetting adhesive) (5) is completely cured, so that sufficient adhesiveness can be secured. According to such an arrangement, it is possible to reinforce a flexible printed circuit board during component mounting and to prevent deterioration in reflow heat resistance during a reflow process. Note here that a temporary pressure-bonding condition under which (B) the bonding material (thermosetting adhesive) is temporarily pressure-bonded to the surface of (C) the photosensitive resin composition cured film can be appropriately selected. For example, it is preferable that the temporary pressure bonding be carried out at a heating temperature of 80° C. to 180° C. and at a pressure of 0.1 MPa to 10 MPa, and it is more preferable that the temporary pressure bonding be carried out at a heating temperature of 100° C. to 150° C. and at a pressure of 0.1 MPa to 1.0 MPa. In a case where the temporary pressure-bonding condition falls below the above range, a problem may occur such that it is impossible to obtain sufficient adhesiveness between (B) the bonding material (thermosetting adhesive) and (C) the photosensitive resin composition cured film. In contrast, in a case where the temporary pressure-bonding condition exceeds the above range, thermosetting of (B) the bonding material (thermosetting adhesive) progresses, so that sufficient adhesiveness between (B) the bonding material (thermosetting adhesive) and (A) the stiffener may not be secured during the heat and pressure molding. A heat and pressure molding condition under which (A) the stiffener is combined with (B) the bonding material (thermosetting adhesive) can be appropriately selected. For example, it is preferable that the combining be carried out at a heating temperature of 100° C. to 200° C. and at a pressure of 0.5 MPa to 10 MPa, and it is more preferable that the combining be carried out at a heating temperature of 150° C. to 180° C. and at a pressure of 0.5 MPa to 1 MPa. In a case where the pressure molding condition falls below the above range, a problem may occur such that sufficient adhesiveness may not be obtained or such that the heat and pressure molding requires much time. In contrast, in a case where the heat and pressure molding condition exceeds the above range, it is feared that large warpage may occur in the stiffener-integrated flexible printed circuit board which has been subjected to heat molding. The stiffener-integrated flexible printed circuit board thus obtained is arranged such that (D) the flexible printed circuit board, (C) the photosensitive resin composition cured film, (B) the bonding material, and (A) the stiffener are laminated in this order so as to be in contact with each other.

From the viewpoint of prevention of foaming during a reflow process, it is preferable that the stiffener-integrated flexible printed circuit board have a peel strength of not less than 1N/cm between (B) the bonding material and (C) the cured film obtained by curing a photosensitive resin composition. In a case where the peel strength falls below the above range, a problem may occur such that foaming during a reflow process causes deterioration in adhesiveness of the stiffener. The peeling may form any peeling interface during measurement of the peel strength between (B) the bonding material and (C) the cured film obtained by curing a photosensitive resin composition is not particularly limited, provided that a peel strength of not less than 1N/cm is obtained. The peeling may be interfacial peeling of (B) the bonding material and (C) the cured film obtained by curing a photosensitive resin composition, or cohesive failure of (B) the bonding material or (C) the cured film obtained by curing a photosensitive resin composition. Alternatively, both the interfacial peeling and the cohesive failure may occur due to the peeling.

It is not particularly limited how to measure the peel strength between (B) the bonding material and (C) the cured film obtained by curing a photosensitive resin composition. For example, the peel strength can be measured by the following method.

First, a Baker type Applicator is used to cast and apply a photosensitive resin composition to a surface (i.e., a copper foil surface) of (D) the flexible printed circuit board on which surface copper foil has not been etched out, and the photosensitive resin composition is dried at 80° C. for 20 minutes so that the photosensitive resin composition thus dried finally has a thickness of 20 μm. (D) The flexible printed circuit board is obtained by etching out copper foil on one side of a flexible double-sided copper-clad laminate (a laminate obtained by adhering copper foil having a thickness of 12 μm to both sides of a polyimide film (APICAL 25NPI, manufactured by Kaneka Corporation) by use of a polyimide adhesive), and (D) the flexible printed circuit board has a width of 5 cm and a length of 11 cm. Thereafter, without using a negative type mask, an entire surface of the photosensitive resin composition is subjected to light exposure by being irradiated with ultraviolet light in an accumulated amount of 300 mJ/cm$^2$,. Subsequently, the photosensitive resin composition is subjected to spray development with a 1.0 wt % sodium carbonate aqueous solution at 30° C. sprayed at a discharge pressure of 0.1 MPa for 60 seconds. After being sufficiently rinsed with pure water after the spray development, the photosensitive resin composition is thermally cured in an oven at 150° C. for 60 minutes, whereby a laminate-1 in which (C) the photosensitive resin composition cured film is laminated on (D) the flexible printed circuit board is prepared. Subsequently, a laminate-2 is prepared by using a heat roll laminator at 185° C. to temporarily pressure-bond (B) the bonding material (thermosetting adhesive, Pyralux LF0100 (trade name) manufactured by DuPont) to an entire surface of (A) the stiffener (polyimide film, APICAL 125NPI (trade name) manufactured by Kaneka Corporation) having a width of 5 cm and a length of 10 cm. Thereafter, a laminate-3 is prepared by causing a surface of (C) the photosensitive resin composition cured film of the laminate-1 and (B) the bonding material surface of the laminate-2 to overlap each other so that the laminate-1 protrudes from the laminate-2 by a length of 1 cm, and the laminate-1 and the laminate-2 are pressure-bonded by hot pressing at a pressure of 2.5 MPa at 165° C. for 90 minutes. Next, by using a hand roller, a double-sided tape is pressure-bonded to an entire surface of one side of a double-sided copper foil glass epoxy substrate having a width of 5 cm, a length of 10 cm, and a thickness of 0.4 mm, so as to prepare a base material for peel strength measurement. The base material for peel strength measurement is constituted by the double-sided copper foil glass epoxy substrate and the double-sided tape. Then, a test piece for peel strength measurement which is constituted by the laminate-3 and the base material for peel strength measurement is prepared by causing (A) the stiffener surface of the laminate-3 and the double-sided tape surface of the base material for peel strength measurement to overlap with each other, and carrying out pressure-bonding by use of a hand roller. The test piece for peel strength measurement thus obtained is cut to cut lines at intervals of 1 cm in width and 10 cm in length in such a way that an edge of a cutter reaches (A) the stiffener from the laminate-1 surface. A part of the laminate-1 which part protrudes from the test piece for peel strength measurement by 1 cm is caught in a zipper of a tensile test machine (Strograph, manufactured by TOYO SEIKI SEISAKU-SHO, LTD.), so as to measure a peel strength under conditions of a tensile direction of 90° with respect to a length direction, a tensile speed of 10 mm/min, and a room temperature of 23° C.

In contrast, according to an arrangement in which (B) the bonding material is not used, as in the case of use of (B) the bonding material, a stiffener-integrated flexible printed circuit board can be manufactured via temporary pressure-bonding of (A) the stiffener (6) to (C) the photosensitive resin composition cured film (4) <step 5> and preparation of the stiffener-integrated flexible printed circuit board by heat and pressure molding <step 6>. However, the present invention is not limited to this. The stiffener-integrated flexible printed circuit board which is obtained in this case is arranged such that (D) the flexible printed circuit board, (C) the photosensitive resin composition cured film, and (A) the stiffener are laminated in this order so as to be in contact with each other.

[(A) Stiffener]

(A) The stiffener of the present invention is not limited provided that (A) the stiffener is a material which is used to reinforce a flexible printed circuit board. However, such materials may be selected as appropriate for intended uses. For example, a thick material of a stiffener is exemplified by paper phenol and a glass epoxy plate. A thin material of a stiffener is exemplified by a polyimide film, a polyester film, and the like. The thin material of a stiffener is also exemplified by metal plates (e.g., a copper plate and an aluminum plate) and the like. In a case where a polyimide film is used for a stiffener, it is possible to obtain a stiffener-integrated flexible printed circuit board which is excellent in heat resistance and plasticity. A polyimide film, which can be appropriately selected, preferably has a thickness of 75 µm to 225 µm and is exemplified by APICAL 125NPI (having a thickness of 125 µm) (trade name) manufactured by Kaneka Corporation. In a case where the polyimide film has a thickness of less than 75 µm, it may be impossible to obtain a supporting property which is necessary for supporting (D) the flexible printed circuit board. In contrast, in a case where the polyimide film has a thickness of more than 225 µm, an entire stiffener-integrated flexible printed circuit board has a too large thickness to follow a trend toward a smaller and lighter stiffener-integrated flexible printed circuit board.

[(B) Bonding Material]

(B) The bonding material of the present invention is not limited provided that (B) the bonding material can adhere (A) the stiffener to (C) the photosensitive resin composition cured film. However, it is preferable that (B) the bonding material allow a prepared stiffener-integrated flexible printed circuit board to have a peel strength of not less than 1 N/cm, more preferably of not less than 2 N/cm, and still more preferably of not less than 3 N/cm between (B) the bonding material and (C) the photosensitive resin composition cured film. A bonding material which allows attainment of the above peel strength can be said to be preferable from the viewpoint of prevention of foaming during a reflow process.

Examples of a bonding material which can be appropriately used as (B) the bonding material include a film, a sheet, an adhesive, a gluing agent, a tape, ink, vanish, and paste each of which may be thermoplastic, non-thermoplastic, thermosetting, ultraviolet curing, moisture curing, or pressure-sensitive as used in general. In particular, the bonding material which is a thermosetting adhesive is preferable since strong bonding power can be obtained by carrying out bonding associated with a thermosetting reaction.

Note here that a thermosetting adhesive is exemplified by an epoxy, acrylic, urethane, or triazine thermosetting adhesive. Such a thermosetting adhesive is preferable since use of such a thermosetting adhesive allows a stiffener-integrated flexible printed circuit board to be excellent in reflow heat resistance.

Note here that either a sheet bonding material or a liquid bonding material can be used as the bonding material. In a case where the bonding material is a liquid bonding material, the bonding material may be applied to a surface of (C) the photosensitive resin composition cured film or to (A) the stiffener, as appropriate.

Note that according to the arrangement in which (B) the bonding material is not used, (A) the stiffener and (C) the photosensitive resin composition cured film need to be bonded sufficiently enough to secure reflow heat resistance. What is meant by "bonding sufficiently enough to secure reflow heat resistance" is a state in which (A) the stiffener and (C) the photosensitive resin composition cured film are bonded to an extent that no change in appearance occurs before and after a reflow heat resistance test carried out in Examples (described later). In order to achieve such bonding, the prepared stiffener-integrated flexible printed circuit board preferably has a peel strength of not less than 1 N/cm, more preferably of not less than 2 N/cm, and still more preferably of not less than 3 N/cm in a test for measuring the peel strength between (A) the stiffener and (C) the photosensitive resin composition cured film of a prepared stiffener-integrated flexible printed circuit board.

[(D) Flexible Printed Circuit Board]

(D) The flexible printed circuit board of the present invention is constituted by a base material and a conductor. The base material is generally exemplified by a heat-resistant film typified by a polyimide film. The conductor is generally exemplified by copper foil, and rolled copper foil, electro-deposited copper foil, or the like is used as the conductor.

In other words, (D) the flexible printed circuit board of the present invention is one on which a circuit is formed by etching, in a given pattern, metal foil of a laminate constituted by at least the metal foil and a dielectric film. The dielectric film is generally exemplified by a heat-resistant film typified by a polyimide film. The metal foil is generally exemplified by copper foil, and rolled copper foil, electro-deposited copper foil, or the like is used as the metal foil.

[(C) Photosensitive Resin Composition Cured Film]

The photosensitive resin composition which is used in the present invention is not particularly limited provided that the photosensitive resin composition is a so-called photosensitive resin composition which is a material that allows drawing of a pattern by development and exposure. Any publicly-known photosensitive resin composition is usable.

Note, however, that in order to further strengthen adhesiveness between the photosensitive resin composition and (B) the bonding material or (A) the stiffener, it is preferable that the photosensitive resin composition be a material which (i) contains (E) a thermosetting resin containing a group reactive with a carboxyl group (may be abbreviated as an "(E) component") and (F) a carboxyl group-containing resin (may be abbreviated as an "(F) component") and (ii) allows drawing of a pattern by development and exposure. Further, for the sake of easily obtaining higher reflow heat resistance, it is preferable that the photosensitive resin composition be a material which (i) contains (E) the thermosetting resin containing a reactive group reactive with a carboxyl group and (F) the carboxyl group-containing resin which contains substantially no photosensitive group in its molecule and (ii) allows drawing of a pattern by development and exposure.

The photosensitive resin composition may also be not only a material which contains the (E) component and the (F) component but also a material which contains at least a urethane bond(s) and allows drawing of a pattern by development and exposure. Namely, the photosensitive resin composition may be a photosensitive resin which contains (I) a compound which contains a urethane bond(s) (may be abbreviated as an "(I) component").

In a case where the photosensitive resin composition of the present invention contains a urethane bond(s), the photosensitive resin composition is estimated to be favorably adhesive enough to be physically adhered to the stiffener by an anchor effect or to be chemically adhered, via a hydrogen bond, to a functional group existing on a surface of the stiffener. Further, it is estimated that a blistering and/or delamination is less likely to occur since a urethane bond(s) is rich in thermal stability and is less likely to be thermally decomposed during a reflow process. In addition, the inventors of the present invention deduced that rich plasticity of a resin containing a urethane bond(s) has allowed a reduction in distortion or warpage after a reflow process.

The photosensitive resin composition may contain (i) the (E) component and the (F) component, (ii) the (I) component, or (iii) the (E) component, the (F) component, and the (I) component.

(C) The photosensitive resin composition cured film functions as an insulating protective film. The functioning as an insulating protective film is exemplified by (i) being microfabricatable, (ii) being developable with a dilute alkaline aqueous solution, (iii) being curable at a low temperature (not more than 200° C.), (iv) being a cured film rich in plasticity and excellent in electric insulation reliability, solder heat resistance, organic solvent resistance, and flame retardancy, (v) having a small post-curing warpage, and (iv) the like.

Note here that the "reactive group reactive with a carboxyl group" (may be referred to as a "reactive group") is exemplified by an epoxy group, an oxetanyl group, an isocyanate group, an amino group, a hydroxyl group, and the like.

It is preferable that the reactive group (e.g., an epoxy group) in (E) the thermosetting resin containing a reactive group reactive with a carboxyl group is 1.0 time to 1.8 times greater in mole than a carboxyl group of (F) the carboxyl group-containing resin. In a case where the above condition is satisfied, a stiffener-integrated flexible printed circuit board has higher reflow heat resistance (see Examples described later).

It is also preferable that the photosensitive resin composition contain (G) an unsaturated double bond-containing resin and (H) a photopolymerization initiator. The following description discusses (E) the thermosetting resin containing a reactive group reactive with a carboxyl group, (F) the carboxyl group-containing resin, (G) the unsaturated double bond-containing resin (may be abbreviated as a "(G) component", (H) the photopolymerization initiator (may be abbreviated as an "(H) component", and (I) the compound which contains a urethane bond(s) (may be abbreviated as the "(I) component").

<(E) Thermosetting Resin Containing Reactive Group Reactive with Carboxyl Group>

(E) The thermosetting resin containing a reactive group reactive with a carboxyl group of the present invention is not particularly limited, and exemplified by an epoxy resin, an oxetane resin, an isocyanate resin, a melamine resin, and the like. Note that the "reactive group reactive with a carboxyl group" may be herein simply referred to as a "reactive group".

The epoxy resin is a compound which contains at least one epoxy group, generates a cross-linked structure by heating, and functions as a heat curing agent. For example, a bisphenol-A epoxy resin is exemplified by jER828, jER1001, and jER1002 (trade names) manufactured by Japan Epoxy Resins Co. Ltd.; ADEKA RESIN EP-4100E and ADEKA RESIN EP-4300E (trade names) manufactured by ADEKA CORPORATION; RE-310S and RE-410S (trade names) manufactured by Nippon Kayaku Co., Ltd.; EPICLON 840S, EPICLON 850S, EPICLON 1050, and EPICLON 7050 (trade names) manufactured by DIC Corporation; and Epo Tohto YD-115, Epo Tohto YD-127, and Epo Tohto YD-128 (trade names) manufactured by Tohto Kasei Co., Ltd. A bisphenol F epoxy resin is exemplified by jER806 and jER807 (trade names) manufactured by Japan Epoxy Resins Co. Ltd.; ADEKA RESIN EP-4901E, ADEKA RESIN EP-4930, and ADEKA RESIN EP-4950 (trade names) manufactured by ADEKA CORPORATION; RE-303S, RE-304S, RE-403S, and RE-404S (trade names) manufactured by Nippon Kayaku Co., Ltd.; EPICLON 830 and EPICLON 835 (trade names) manufactured by DIC Corporation; and Epo Tohto YDF-170, Epo Tohto YDF-175S, and Epo Tohto YDF-2001 (trade names) manufactured by Tohto Kasei Co., Ltd. A bisphenol S epoxy resin is exemplified by EPICLON EXA-1514 (trade name) manufactured by DIC Corporation. A hydrogenated bisphenol-A epoxy resin is exemplified by jERYX8000, jERYX8034, and jERYL7170 (trade names) manufactured by Japan Epoxy Resins Co. Ltd.; ADEKA RESIN EP-4080E (trade name) manufactured by ADEKA CORPORATION; EPICLON EXA-7015 (trade name) manufactured by DIC Corporation; and Epo Tohto YD-3000 and Epo Tohto YD-4000D (trade names) manufactured by Tohto Kasei Co., Ltd. A biphenyl epoxy resin is exemplified by jERYX4000, jERYL6121H, jERYL6640, and jERYL6677 (trade names) manufactured by Japan Epoxy Resins Co. Ltd.; and NC-3000 and NC-3000H (trade names) manufactured by Nippon Kayaku Co., Ltd. A phenoxy epoxy resin is exemplified by jER1256, jER4250, and jER4275 (trade names) manufactured by Japan Epoxy Resins Co. Ltd. A naphthalene epoxy resin is exemplified by EPICLON HP-4032, EPICLON HP-4700, and EPICLON HP-4200 (trade names) manufactured by DIC Corporation; and NC-7000L (trade name) manufactured by Nippon Kayaku Co., Ltd. A phenol novolac epoxy resin is exemplified by jER152 and jER154 (trade names) manufactured by Japan Epoxy Resins Co. Ltd.; EPPN-201-L (trade name) manufactured by Nippon Kayaku Co., Ltd.; EPICLON N-740 and EPICLON N-770 (trade names) manufactured by DIC Corporation; and Epo Tohto YDPN-638 (trade name) manufactured by Tohto Kasei Co., Ltd. A cresol novolac epoxy resin is exemplified by EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by DIC Corporation. A trisphenol methane epoxy resin is exemplified by EPPN-501H, EPPN-501HY, and EPPN-502H (trade names) manufactured by Nippon Kayaku Co., Ltd. A dicyclopentadiene epoxy resin is exemplified by XD-1000 (trade name) manufactured by Nippon Kayaku Co., Ltd.; and EPICLON HP-7200 (trade name) manufactured by DIC Corporation. An amine epoxy resin is exemplified by Epo Tohto YH-434 and Epo Tohto YH-434L (trade names) manufactured by Tohto Kasei Co., Ltd. A flexible epoxy resin is exemplified by jER871, jER872, jERYL7175, and jERYL7217 (trade names) manufactured by Japan Epoxy Resins Co. Ltd.; and EPICLON EXA-4850 (trade name) manufactured by DIC Corporation. An urethane-modified epoxy resin is exemplified by ADEKA RESIN EPU-6, ADEKA RESIN EPU-73, and ADEKA RESIN EPU-78-11 (trade names) manufactured by ADEKA CORPORATION. A rubber-modified epoxy resin is exemplified by ADEKA RESIN EPR-4023, ADEKA RESIN EPR-4026, and ADEKA RESIN EPR-1309 (trade names) manufactured by ADEKA CORPORATION. A chelate-modified epoxy resin is exemplified by ADEKA RESIN EP-49-10 and ADEKA RESIN EP-49-20 (trade names) manufactured by ADEKA CORPORATION; and the like. The above epoxy resin components may be used alone, or two or more of the epoxy resin components may be used in combination.

In a case where (E) the thermosetting resin containing a reactive group reactive with a carboxyl group contains the at least one epoxy group as the reactive group, (C) the photosensitive resin composition cured film can be provided with (i) heat resistance and (ii) adhesiveness to a conductor such as metal foil and to a circuit board.

The oxetane resin is a compound which contains at least one oxetanyl group, generates a cross-linked structure by heating, and functions as a heat curing agent. For example, the oxetane resin is exemplified by ARON OXETANE OXT-101, ARON OXETANE OXT-121, ARON OXETANE OXT-211, ARON OXETANE OXT-212, ARON OXETANE OXT-221, and ARON OXETANE OXT-610 (trade names) manufactured by TOAGOSEI CO., LTD.; oxetanyl silsesquioxane; phenol novolac oxetane; and the like. In a case where (E) the thermosetting resin containing a reactive group reactive with a carboxyl group contains the at least one oxetanyl group as the reactive group, (C) the photosensitive resin composition cured film can be provided with (i) heat resistance and (ii) adhesiveness to a conductor such as metal foil and to a circuit board.

The isocyanate resin is a compound which contains at least one isocyanate group, generates a cross-linked structure by heating, and functions as a heat curing agent. For example, the isocyanate resin is exemplified by diisocyanates such as aromatic diisocyanates such as tolylene diisocyanate, xylylene diisocyanate, diphenylmethane diisocyanate, polymeric diphenylmethane diisocyanate, naphthalene diisocyanate, tolidine diisocyanate, tetramethyl xylene diisocyanate, and the like; alicyclic diisocyanates such as hydrogenated diphenylmethane diisocyanate, hydrogenated xylylene diisocyanate, isophorone diisocyanate, norbornene diisocyanate, and the like; aliphatic diisocyanates such as hexamethylene diisocyanate, trimethyl hexamethylene diisocyanate, lysine diisocyanate, and the like; and the like. It is also possible to use a block isocyanate resin or the like obtained by stabilizing the isocyanate resin by use of a block agent. The block isocyanate resin is a compound which is inactive at a normal temperature and in which a block agent such as an oxime block agent, a diketone block agent, a phenol block agent, a caprolactam block agent, or the like which is heated is dissociated, so as to regenerate an isocyanate group. For example, the block isocyanate resin is exemplified by DURANATE 17B-60PX, DURANATE TPA-B80E, DURANATE MF-B60X, DURANATE MF-K60X, and DURANATE E402-B80T (trade names) manufactured by Asahi Kasei Chemicals Corporation; Takenate B-830, Takenate B-815N, Takenate B-846N, and Takenate B-882N (trade names) manufactured Mitsui Chemicals Polyurethanes, Inc.; Collonate AP-M, Collonate 2503, Collonate 2507, Collonate 2513, and Collonate 2515, and Millionate MS-50 (trade names) manufactured by Nippon Polyurethane Industry Co., Ltd.; and the like. In a case where (E) the thermosetting resin containing a reactive group reactive with a carboxyl group contains the at least one isocyanate group as the reactive group, (C) the photosensitive resin composition cured film can be provided with (i) heat resistance and (ii) adhesiveness to a conductor such as metal foil and to a circuit board.

The melamine resin is a compound which is a resin obtained by reacting melamine and formaldehyde together, generates a cross-linked structure by heating, and functions as a heat curing agent. For example, a trimethyl ether melamine resin is exemplified by Resimene R717 and Resimene R718 (trade names) manufactured by INEOS Melamines. A pentamethyl ether melamine resin is exemplified by Resimene R741 (trade name) manufactured by INEOS Melamines. A hexamethyl ether melamine resin is exemplified by Resimene R745 and Resimene R747 (trade names) manufactured by INEOS Melamines. A methylol group-containing methyl ether melamine resin is exemplified by Resimene R730 and Resimene R735 (trade names) manufactured by INEOS Melamines; and the like. In a case where (E) the thermosetting resin containing a reactive group reactive with a carboxyl group contains the melamine resin, (C) the photosensitive resin composition cured film can be provided with (i) heat resistance and (ii) adhesiveness to a conductor such as metal foil and to a circuit board.

The photosensitive resin composition contains the (E) component of the present invention such as an epoxy resin or the like preferably in 0.5 part by weight to 100 parts by weight, more preferably in 1 part by weight to 50 parts by weight, and particularly preferably in 5 parts by weight to 20 parts by weight, with respect to 100 parts by weight of components of the photosensitive resin composition other than the (E) component (e.g., a total of the (F) component, the (G)

component, and the (H) component). In a case where an amount of the (E) component such as an epoxy resin or the like is adjusted to fall within the above range, (C) the photosensitive resin composition cured film can improve in heat resistance, chemical resistance, and electric insulation reliability. Therefore, the (E) component such as an epoxy resin or the like whose amount is adjusted to fall within the above range is preferable.

In a case where the photosensitive resin composition contains the (E) component such as an epoxy resin or the like in an amount falling below the above range, (C) the photosensitive resin composition cured film may be inferior in heat resistance and electric insulation reliability. In a case where the photosensitive resin composition contains the (E) component such as an epoxy resin or the like in an amount exceeding the above range, (C) the photosensitive resin composition cured film may be fragile, inferior in plasticity, and large in warpage.

Meanwhile, in a case where a reactive group such as an epoxy group or the like in the (E) component such as an epoxy resin or the like is 1.0 time to 1.8 times greater in mole than a carboxyl group of the (F) component, favorable reflow heat resistance is obtained. In a case where the photosensitive resin composition contains the (E) component such as an epoxy resin or the like in an amount falling below the above range, it may be impossible to obtain sufficient adhesiveness between the photosensitive resin composition cured film and the stiffener or the thermosetting adhesive, or reflow heat resistance may deteriorate since sufficient mechanical strength cannot be obtained. In a case where the photosensitive resin composition contains the (E) component such as an epoxy resin or the like in an amount exceeding the above range, (C) the photosensitive resin composition cured film becomes highly absorbent, and reflow heat resistance may deteriorate during moisture absorption.

Note here that (i) the number of moles of the reactive group (e.g., an epoxy group) contained in the (E) component such as an epoxy resin or the like and (ii) the number of moles of the carboxyl group contained in the (F) component are found based on the following equations:

Number of moles of reactive group (e.g., epoxy group)=reciprocal of reactive group equivalent (e.g., epoxy equivalent)×solid content of resin (e.g., epoxy resin) component (Equation 1)

Number of moles of carboxyl group contained in (F) component=(acid value of (F) component/molecular weight of potassium hydroxide/1000)× solid content of (F) component (Equation 2)

Note here that reactive group equivalent (e.g., epoxy equivalent) in Equation 1 refers to the number of grams (g/eq) of a resin containing one gram equivalent of the reactive group (e.g., an epoxy group).

Note also that acid value of (F) component in Equation 2 is found by a method (described later) and a molecular weight of potassium hydroxide is 56.11 g/mol.

<(F) Carboxyl group-containing Resin>

(F) The carboxyl group-containing resin of the present invention is a polymer which contains at least one carboxyl group in its molecule and has a weight average molecular weight of not less than 3,000 and not more than 300,000 based on polyethylene glycol. According to the present invention, it is preferable that the (F) component be a carboxyl group-containing resin which contains substantially no photosensitive group in its molecule. This is because such a carboxyl group-containing resin prevents a too much increase in crosslink density of a cured film to be obtained by curing a photosensitive resin composition and allows the cured film to have both reflow heat resistance and plasticity. Note here that a molecular weight of (F) the carboxyl group-containing resin is measured by, for example, the following method.

Used device: counterpart of HLC-8220GPC manufactured by TOSOH CORPORATION
Column: TSK gel Super AWM-H (6.0 mml. D×15 cm) manufactured by TOSOH CORPORATION×2
Guard column: TSK guard column Super AW-H manufactured by TOSOH CORPORATION
Eluent: 30 mM LiBr+20 mM H3PO4 in DMF
Flow rate: 0.6 mL/min
Column temperature: 40° C.
Detection condition: RI: polarity (+), response (0.5 sec)
Sample concentration: approximately 5 mg/mL
Standard sample: PEG (polyethylene glycol)

(F) The carboxyl group-containing resin whose weight average molecular weight is controlled to fall within the above range is preferable since the photosensitive resin composition is excellent in alkali developing property and the cured film to be obtained is excellent in plasticity and chemical resistance. (F) The carboxyl group-containing resin which has a weight average molecular weight of less than 3,000 may cause deterioration in plasticity and chemical resistance of the cured film. (F) The carboxyl group-containing resin which has a weight average molecular weight of more than 300,000 may cause deterioration in alkali developing property of the photosensitive resin composition and an increase in viscosity of the photosensitive resin composition.

An acid value of (F) the carboxyl group-containing resin which is used in the present invention can be measured by, for example, a method prescribed by JIS K5601-2-1. (F) The carboxyl group-containing resin has an acid value preferably of 50 mgKOH/g to 200 mgKOH/g, and more preferably of 50 mgKOH/g to 150 mgKOH/g. (F) The carboxyl group-containing resin which has an acid value of less than 50 mgKOH/g may cause deterioration in alkali developing property of the photosensitive resin composition. (F) The carboxyl group-containing resin which has an acid value of more than 200 mgKOH/g may cause an increase in absorbency of the cured film and deterioration in electric insulation reliability of the cured film.

More specifically, according to the present invention, the (F) component which contains substantially no photosensitive group in its molecule is not particularly limited. For example, the (F) component which contains substantially no photosensitive group in its molecule is exemplified by a carboxyl group-containing (meth)acrylic copolymer, a carboxyl group-containing vinyl copolymer, acid-modified polyurethane, acid-modified polyester, acid-modified polycarbonate, acid-modified polyamide, acid-modified polyimide, and the like. These components can be used alone or in combination of two or more kinds.

"Containing substantially no photosensitive group in a molecule" means containing, in a molecule, substantially no radical polymerizable group whose polymerization reaction progresses by a radical polymerization initiator. For example, a photosensitive group is exemplified by a (meth)acryloyl group and a vinyl group. Note that "containing substantially no photosensitive group in a molecule" may refer to containing no photosensitive group or containing a photosensitive group at an iodine value of not more than 5. The iodine value of the carboxyl group-containing resin which is used in the present invention and serves as the (F) component can be measured by, for example, a method prescribed by JIS K0070. A carboxyl group-containing resin which has an iodine value of not more than 5 contributes to the photocuring reaction to an extremely small extent. This makes it possible to attain the effect of the present invention. A carboxyl group-containing resin which has an iodine value of more than 5 makes a large contribution to the photocuring reaction. This lowers plasticity of the cured film, thereby preventing the effect of the present invention.

According to the present invention, the (F) component which contains substantially no photosensitive group in its molecule is not particularly limited provided that the (F) component has the above structure. More preferably, a component obtained by copolymerizing at least (meth)acrylic acid and (meth)acrylic acid alkyl ester is used as the (F) component. The (F) component which has such a structure is preferable since the structure allows a photosensitive resin composition to be excellent in photosensitivity and produce a cured film excellent in plasticity and chemical resistance. Note here that (meth)acrylic acid, which refers to acrylic acid and/or methacrylic acid, is similar in meaning to (meth) of the present invention.

The (meth)acrylic acid alkyl ester is a compound which contains, in an ester chain of (meth)acrylic acid ester, an alkyl group having a carbon number 1 to 20. For example, the (meth)acrylic acid alkyl ester is exemplified by (meth)acrylic acid methyl, (meth)acrylic acid ethyl, (meth)acrylic acid butyl, (meth)acrylic acid isobutyl, (meth)acrylic acid tertiary butyl, (meth)acrylic acid hexyl, (meth)acrylic acid 2-ethylhexyl, (meth)acrylic acid octyl, (meth)acrylic acid nonyl, (meth)acrylic acid decyl, (meth)acrylic acid dodecyl, (meth)acrylic acid stearyl, and the like. These (meth)acrylic acid alkyl esters can be used alone or in combination of two or more kinds. From the viewpoint of plasticity and chemical resistance of a cured film of a photosensitive resin composition, it is preferable to use particularly (meth)acrylic acid methyl, (meth)acrylic acid ethyl, or (meth)acrylic acid butyl of the (meth)acrylic acid alkyl esters.

A reaction (described earlier) in which at least (meth)acrylic acid and (meth)acrylic acid alkyl ester are copolymerized can progress by, for example, causing a radical polymerization initiator to generate radical. For example, the radical polymerization initiator is exemplified by azo compounds such as azobisisobutyronitrile, azobis(2-methylbutyronitrile), 2,2'-azobis-2,4-dimethylvaleronitrile, and the like; organic peroxides such as t-butylhydroperoxide, cumene hydroperoxide, benzoyl peroxide, dicumyl peroxide, di-t-butyl peroxide, and the like; persulfates such as potassium persulfate, sodium persulfate, ammonium persulfate, and the like; hydrogen peroxide; and the like. These radical polymerization initiators can be used alone or in combination of two or more kinds.

The radical polymerization initiator is used in an amount preferably of 0.001 part by weight to 5 parts by weight, and more preferably of 0.01 part by weight to 1 part by weight, where monomers to be used are 100 parts by weight. The radical polymerization initiator which is used in less than 0.001 part by weight prevents the reaction from progressing easily. The radical polymerization initiator which is used in more than 5 parts by weight may cause a decrease in molecular weight of the monomer.

The above reaction, which can be caused by use of no solvent, is desirably caused by use of an organic solvent so as to control the reaction. For example, the organic solvent is exemplified by sulfoxide solvents such as dimethyl sulfoxide, diethyl sulfoxide, and the like; formamide solvents such as N,N-dimethylformamide, N,N-diethylformamide, and the like; acetamide solvents such as N,N-dimethyl acetamide, N,N-diethyl acetamide, and the like; pyrrolidone solvents such as N-methyl-2-pyrrolidone, N-vinyl-2-pyrrolidone, and the like; hexamethylphosphoramide; γ-butyrolactone; and the like. Further, according to need, it is possible to use, in combination, such organic polarity solvents and aromatic hydrocarbon such as xylene, toluene, or the like.

Further, for example, it is also possible to use a solvent exemplified by symmetric glycol diethers such as methylmonoglyme(1,2-dimethoxy ethane), methyldiglyme(bis(2-methoxy ethyl)ether), methyltriglyme(1,2-bis(2-methoxyethoxy)ethane), methyltetraglyme(bis[2-(2-methoxyethoxyethyl)]ether), ethylmonoglyme(1,2-diethoxyethane), ethyldiglyme(bis(2-ethoxyethyl)ether), butyldiglyme(bis(2-butoxyethyl)ether), and the like; acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, acetic acid 2-(2-butoxy ethoxy)ethyl)), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, 1,3-butylene glycol diacetate, and the like; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether, and the like. Of these solvents, it is preferable to use symmetric glycol diethers, which are less likely to cause a secondary reaction.

It is preferable that an amount in which a solvent is used during the reaction be set so that a reaction solution has a solute weight concentration, i.e., a solution concentration of not less than 5 wt % and not more than 90 wt %. It is more preferable that the reaction solution have a solution concentration of not less than 20 wt % and not more than 70 wt %. The reaction solution which has a solution concentration of less than 5 wt % prevents a polymerization reaction from being easily initiated and causes a reaction rate to be slow, whereby a desired structured material would not be obtained. The reaction solution which has a solution concentration of more than 90 wt % causes the reaction solution to have high viscosity and may prevent the reaction from occurring uniformly.

The reaction takes place at a temperature preferably of 20° C. to 120° C., and more preferably of 50 to 100° C. The reaction at a temperature of less than 20° C. proceeds over an excessively long reaction time, and the reaction at a temperature of more than 120° C. may cause abrupt progress of the reaction and/or gelatinization due to three-dimensional crosslinking caused by a side reaction. The reaction time can be appropriately selected in accordance with a batch scale and a reaction condition to be employed.

Note that (F) the carboxyl group-containing resin may be a resin which contains a urethane bond(s).

[(G) Unsaturated Double Bond-containing Resin]

(G) The unsaturated double bond-containing resin of the present invention is a resin in which a chemical bond(s) is formed by (H) the photopolymerization initiator. Further, it is preferable that the unsaturated double bond be an acrylic group ($CH_2$=CH-group), a methacryloyl group (CH=C($CH_3$)-group), or a vinyl group (—CH=CH-group). For example, (G) the unsaturated double bond-containing resin which is preferably used in the present invention is exemplified by bisphenol F EO-modified (n=2 to 50) diacrylate, bisphenol-A EO-modified (n=2 to 50) diacrylate, bisphenol S EO-modified (n=2 to 50) diacrylate, bisphenol F EO-modified (n=2 to 50) dimethacrylate, bisphenol-A EO-modified (n=2 to 50) dimethacrylate, bisphenol S EO-modified (n=2 to 50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexacrylate, tetramethylol propane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylol propane tetramethacrylate, tetraethylene glycol dimethacrylate, methoxy diethylene glycol methacrylate, methoxy polyethylene glycol methacrylate, β-methacryloyl oxyethyl hydrogen phthalate, β-methacryloyl oxyethyl hydrogen succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyl oxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxy propane, 2,2-bis[4-(methacryloxy ethoxy)phenyl]propane, 2,2-bis[4-(methacryloxy.diethoxy)phenyl]propane, 2,2-bis[4-(methacryloxy.polyethoxy)phenyl]propane, polyethylene glycol diacrylate, tripropylene glycol diacrylate, polypropylene glycol diacrylate, 2,2-bis[4-(acryloxy.diethoxy)phenyl]propane, 2,2-bis[4-(acryloxy.polyethoxy)phenyl]propane, 2-hydroxy-1-acryloxy-3-methacryloxy propane, trimethylol propane trimethacrylate, tetramethylol methane triacrylate, tetramethylol methane tetraacrylate, methoxy dipropylene glycol methacrylate, methoxy triethylene glycol acrylate, nonyl phenoxypolyethylene glycol acrylate, nonyl phenoxypolypropylene glycol acrylate, 1-acryloyl oxypropyl-2-phthalate, isostearyl acrylate, polyoxyethylene alkyl ether acrylate, nonyl phenoxyethylene glycol acrylate, polypropylene glycol dimethacrylate, 1,4-butanediol dimethacrylate, 3-methyl-1,5-pentanediol dimethacrylate, 1,6-hexanediol dimethacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecane dimethanol diacrylate, 2,2-hydrogenated bis[4-(acryloxy.polyethoxy)phenyl]propane, 2,2-bis[4-(acryloxy.polypropoxy)phenyl]propane, 2,4-diethyl-1,5-pentanediol diacrylate, ethoxylated trimethylolpropane triacrylate, propoxylated trimethylolpropane triacrylate, isocyanurate tri(ethane acrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, isocyanurate triallyl, glycidyl methacrylate, glycidyl allyl ether, 1,3,5-triacryloyl hexahydro-s-triazine, triallyl 1,3,5-benzene carboxylate, triallylamine, triallyl citrate, triallyl phosphate, allobarbital, diallylamine, diallyl dimethyl silane, diallyl disulfide, diallyl ether, diallyl sialylate, diallyl isophthalate, diallyl terephthalate, 1,3-diallyloxy-2-propanol, diallyl sulfide diallyl maleate, 4,4'-isopropylidene diphenol dimethacrylate, 4,4'-isopropylidene diphenol diacrylate, and the like. However, (G) the unsaturated double bond-containing resin is not limited to these. In particular, (G) the unsaturated double bond-containing resin in which EO (ethylene oxide) contained in one molecule of diacrylate or methacrylate has 2 repeating units to 50 repeating units is preferable, and (G) the unsaturated double bond-containing resin in which EO (ethylene oxide) contained in one molecule of diacrylate or methacrylate has 2 repeating units to 40 repeating units is more preferable. Use of (G) the unsaturated double bond-containing resin in which EO has 2 repeating units to 50 repeating units allows (i) higher solubility of a photosensitive resin composition in an aqueous developer typified by an alkaline aqueous solution and (ii) a shorter development time. Further, (G) the unsaturated double bond-containing resin in which EO has 2 repeating units to 50 repeating units is characteristic in (i) that the unsaturated double bond-containing resin causes stress to be less likely to remain in (C) the photosensitive resin composition cured film and (ii) that the unsaturated double bond-containing resin can prevent a curl of (D) the flexible printed circuit board during laminating of (C) the photosensitive resin composition cured film on (D) the flexible printed circuit board.

In particular, from the viewpoint of enhancement of developing property, it is particularly preferable to use, in combination, (i) the EO-modified diacrylate or methacrylate and (ii) an acrylic resin containing three or more acrylic groups or methacrylic groups. For example, an acrylic resin which is suitably used is exemplified by ethoxylated isocyanurate EO-modified triacrylate, ethoxylated isocyanurate EO-modified trimethacrylate, ethoxylated trimethylolpropane triacrylate, ethoxylated trimethylolpropane triacrylate, ethoxylated trimethylolpropane triacrylate, trimethylolpropane triacrylate, propoxylated trimethylolpropane triacrylate, pentaerythritol triacrylate, ethoxylated pentaerythritol tetraacrylate, ethoxylated pentaerythritol tetraacrylate, ditrimethylolpropane tetraacrylate, ditrimethylolpropane tetraacrylate, propoxylated pentaerythritol tetraacrylate, pentaerythritol tetraacrylate, dipentaerythritol hexacrylate, 2,2,2-trisacryloyloxymethyl ethyl succinic acid, 2,2,2-trisacryloyloxymethyl ethylphthalic acid, propoxylated ditrimethylolpropane tetraacrylate, propoxylated dipentaerythritol hexacrylate, ethoxylated isocyanurate triacrylate, ∈-caprolactone-modified tris-(2-acryloxyethyl)isocyanurate, caprolactone-modified ditrimethylolpropane tetraacrylate, a compound represented by the following General Formula (1):

[Chem. 1]

General Formula (1)

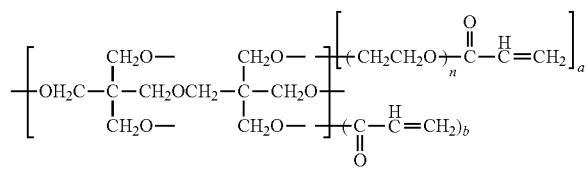

wherein a+b=6, n=12, a compound represented by the following General Formula (2):

[Chem. 2]

General Formula (2)

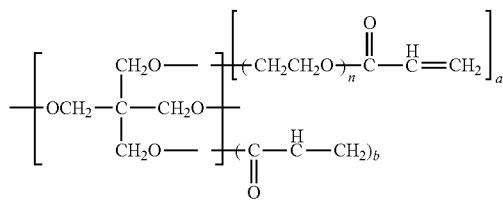

wherein a+b=4, n=4, a compound represented by the following Formula (3):

[Chem. 3]

Formula (3)

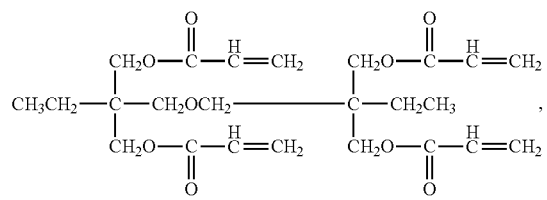

a compound represented by the following General Formula (4):

[Chem. 4]

General Formula (4)

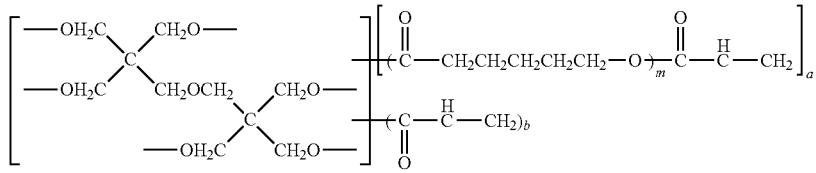

wherein (i) m=1, a=2, b=4, (ii) m=1, a=3, b=3, (iii) m=1, a=6, b=0, or (iv) m=2, a=6, b=0, a compound represented by the following General Formula (5):

[Chem .5]

General Formula (5)

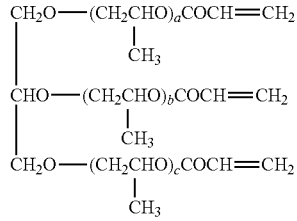

wherein a+b+c=3.6, a compound represented by the following Formula (6):

[Chem. 6]

Formula (6)

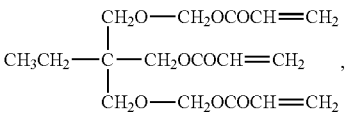

a compound represented by the following General Formula (7):

[Chem. 7]

General Formula (7)

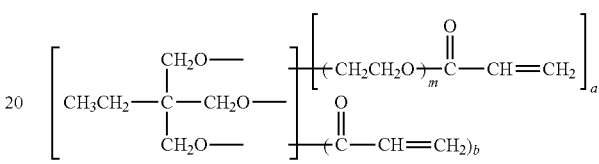

wherein m·a=3, a+b=3 where "m·a" is a product of m and a, and the like.

An acrylic resin containing a hydroxy group or a carbonyl group in a molecular structure skeleton is also preferably used and exemplified by 2-hydroxy-3-phenoxypropyl acrylate, phetalic acid monohydroxyethyl acrylate, ω-carboxy-polycaprolactone monoacrylate, acrylic acid dimer, and pentaerythritol tri and tetraacrylate, and the like.

It is possible to use, as (G) the unsaturated double bond-containing resin, not only the above acrylic resins but also any unsaturated double bond-containing resin exemplified by epoxy-modified acrylic (methacrylic) resin, urethane-modified acrylic (methacrylic) resin, polyester-modified acrylic (methacrylic) resin, and the like.

Note that it is possible to use (G) the unsaturated double bond-containing resins alone and that it is preferable to use (G) the unsaturated double bond-containing resins in combination of two or kinds from the viewpoint of enhancement of heat resistance of a cured film which has been subjected to photocuring.

From the viewpoint of enhancement of photosensitivity of a photosensitive resin composition, it is preferable that the photosensitive resin composition contain (G) the unsaturated double bond-containing resin in 10 parts by weight to 200 parts by weight with respect to 100 parts by weight of components of the photosensitive resin composition other than the (G) component (e.g., a total of the (E) component and the (F) component).

In a case where the photosensitive resin composition contains the (G) component in an amount falling below the above range, a cured film obtained by subjecting the photosensitive resin composition to photocuring has lower alkali resistance, and a weaker contrast may be formed on the cured film by exposure and development. In a case where the photosensitive resin composition contains the (G) component in an amount exceeding the above range, a coated film obtained by applying a solution of the photosensitive resin composition to a substrate and drying a solvent is highly sticky. This causes a reduction in productivity of (C) the photosensitive resin composition cured film. Further, in this case, (C) the photosensitive resin composition cured film may be fragile and be easily broken due to its too high crosslink density. In a case where the photosensitive resin composition contains the (G) component in an amount falling within the above range, exposure and development can be carried out with a resolution in an optimum range.

[(H) Photopolymerization Initiator]

(H) The photopolymerization initiator of the present invention is a compound which is activated by energy such as UV, and initiates and promotes a reaction of (G) the unsaturated double bond-containing resin. For example, (H) the photopolymerization initiator is exemplified by Michler's ketone, 4,4'-bis(diethylamino)benzophenone, 4,4',4''-tris(dimethylamino)triphenylmethane, 2,2'-bis(2-chlorophenyl)-4,4',5,5'-tetraphenyl-1,2'-diimidazole, acetophenone, benzoin, 2-methylbenzoin, benzoin methyl ether, benzoin ethyl ether, benzoin isopropyl ether, benzoin isobutyl ether, 2-t-butyl anthraquinone, 1,2-benzo-9,10-anthraquinone, methyl anthraquinone, thioxanthone, 2,4-diethylthioxanthone, 2-isopropylthioxanthone, 1-hydroxy cyclohexyl phenyl ketone, diacetyl benzyl, benzyl dimethyl ketal, benzyl diethyl ketal, 2 (2'-furyl ethylidene)-4,6-bis(trichloromethyl)-S-triazine, 2[2' (5''-methyl furyl)ethylidene]-4,6-bis(trichloromethyl)-S-triazine, 2(p-methoxyphenyl)-4,6-bis(trichloromethyl)-S-triazine, 2,6-di(p-azido benzal)-4-methyl cyclohexanone, 4,4'-diazido chalcone, di(tetraalkylammonium)-4,4'-diazido stilbene-2,2'-disulfonate, 2,2-dimethoxy-1,2-diphenylethane-1-on, 1-hydroxy-cyclohexyl-phenyl-ketone, 2-hydroxy-2-methyl-1-phenyl-propane-1-on, 1-[4-(2-hydroxy ethoxy)-phenyl]-2-hydroxy-2-methyl-1-propane-1-on, 2-methyl-1-[4-(methylthio)phenyl]-2-morpholinopropane-1-on, 2-benzyl-2-dimethylamino-1-(4-morpholinophenyl)-butane-1, bis(2,4,6-trimethylbenzoyl)-phenylphosphine oxide, bis(2,6-dimethoxybenzoyl)-2,4,4-trimethyl-pentylphosphine oxide, 2,4,6-trimethylbenzoyl-diphenyl-phosphine oxide, 2-hydroxy-2-methyl-1-phenyl-propane-1-ketone, bis(n5-2,4-cyclopentadiene-1-yl)-bis(2,6-difluoro-3-(1H-pyrrole-1-yl)-phenyl)titanium, 1,2-octanedione, 1-[4-(phenylthio)-,2-(O-benzoyl oxime)], iodonium, (4-methylphenyl)[4-(2-methylpropyl)phenyl]-hexafluorophosphate(1-), ethyl-4-dimethylamino benzoate, 2-ethylhexyl-4-dimethylamino benzoate, ethanone, 1-[9-ethyl-6-(2-methylbenzoyl)-9H-carbazole-3-yl]-, 1-(O-acetyl oxime), and the like. (H) The photopolymerization initiators mentioned above are desirably appropriately selected. It is desirable to use (H) the photopolymerization initiators by mixing one or more kinds or mixing two or more kinds.

It is preferable that the photosensitive resin composition contain (H) the photopolymerization initiator of the present invention in 0.1 part by weight to 50 parts by weight with respect to 100 parts by weight of a total of the (E) component, the (F) component, and the (G) component. Alternatively, the photosensitive resin composition may contain (H) the photopolymerization initiator of the present invention in 0.1 part by weight to 50 parts by weight with respect to 100 parts by weight of components of the photosensitive resin composition other than the (H) component (e.g., a total of the (E) component, the (F) component, the (G) component, and the (I) component). In other words, it is preferable that the photosensitive resin composition contain (H) the photopolymerization initiator of the present invention in 0.1 part by weight to 50 parts by weight with respect to 100 parts by weight of components of the photosensitive resin composition.

The photosensitive resin composition which contains (H) the photopolymerization initiator of the present invention in the above ratio is preferable since the photosensitive resin composition has higher photosensitivity.

In a case where the photosensitive resin composition contains the (H) component in an amount falling below the above range, a reaction of a radical polymerizable group does not occur easily during light irradiation, so that the photosensitive resin composition may be frequently insufficiently cured. In a case where the photosensitive resin composition contains the (H) component in an amount exceeding the above range, it is difficult to adjust an amount of light irradiation, so that the photosensitive resin composition may be overexposed. Therefore, in order to cause a photocuring reaction to progress efficiently, it is preferable that an amount in which the photosensitive resin composition contains the (H) component be adjusted to fall within the above range.

[(I) Compound Containing Urethane Bond(s)]

(I) A compound of the present invention which compound contains a urethane bond(s) encompasses all monomers and polymers provided that the compound contains, in its molecule, a compound which contains at least one urethane bond. Note that (I) a resin of the present invention which resin contains a urethane bond(s) has a weight average molecular weight preferably of not less than 2,000 and not more than 50,000, more preferably of not less than 5,000 and not more than 30,000, and particularly preferably of not less than 5,000 and not more than 20,000, based on polyethylene glycol. (I) The resin which contains a urethane bond(s) and has a weight average molecular weight that is controlled to fall within the above range is preferable since the photosensitive resin composition is excellent in alkali developing property and (C) the photosensitive resin composition cured film to be obtained is excellent in plasticity.

(I) The compound of the present invention which compound contains a urethane bond(s) is not particularly limited provided that the compound has the above structure. It is preferable that (I) the compound of the present invention which compound contains a urethane bond(s) be (i1) a resin which contains no unsaturated double bond in its molecule and contains a urethane bond(s) in its molecule and/or (i2) a resin which contains a unsaturated double bond(s) in its molecule and contains a urethane bond(s) in its molecule.

It is preferable that (I) the compound of the present invention which compound contains a urethane bond(s) be contained in the photosensitive resin composition in 1 part by weight to 100 parts by weight, preferably in 10 parts by weight to 90 parts by weight, and particularly preferably in 30 parts by weight to 70 parts by weight, with respect to 100 parts by weight of the photosensitive resin composition.

Note that it is preferable that (I) the compound which contains a urethane bond(s) be used alone or in combination of two or more kinds from the viewpoint of enhancement of plasticity and heat resistance of a cured film which has been subjected to photocuring.

Note also that the photosensitive resin composition which is used for the stiffener-integrated flexible printed circuit board of the present embodiment may contain not only (I) the compound which contains a urethane bond(s) but also (E) the thermosetting resin containing a reactive group reactive with a carboxyl group and (F) the carboxyl group-containing resin.

Alternatively, the photosensitive resin composition of the stiffener-integrated flexible printed circuit board of the present embodiment may contain not only (I) the compound which contains a urethane bond(s) but also (E) the thermosetting resin containing a reactive group reactive with a carboxyl group and (F) the carboxyl group-containing resin which contains substantially no photosensitive group in its molecule.

<(i1) Resin Containing No Unsaturated Double Bond in Molecule and Containing Urethane Bond in Molecule>

(i1) The resin of the present invention which resin contains no unsaturated double bond in its molecule and contains a urethane bond(s) in its molecule is not particularly limited provided that the resin (i) contains at least one urethane bond in its molecule and (ii) contains no unsaturated double bond in its molecule. More preferably, (i1) the resin of the present invention which resin contains no unsaturated double bond in its molecule and contains a urethane bond(s) in its molecule is obtained by reacting at least (a) a diisocyanate compound and (b) a diol compound together. (a) The diisocyanate compound and (b) the diol compound react with each other at a temperature preferably of 40° C. to 160° C., and more preferably of 60° C. to 150° C. The reaction at a temperature of less than 40° C. causes a reaction time to be too long, and the reaction at a temperature of more than 160° C. is highly likely to cause gelatinization due to occurrence of a three-dimensional structure-forming reaction during the reaction. The reaction time can be appropriately selected in accordance with a batch scale and a reaction condition to be employed. Further, according to need, the reaction may be carried out in the presence of a catalyst such as tertiary amines; alkali metals; alkaline earth metals; metals such as tin, zinc, titanium, cobalt, or the like; semimetal compounds; or the like.

The above reaction, which can be caused by use of no solvent, is desirably caused by use of an organic solvent so as to control the reaction. For example, the organic solvent is exemplified by sulfoxide solvents such as dimethyl sulfoxide, diethyl sulfoxide, and the like; formamide solvents such as N,N-dimethylformamide, N,N-diethylformamide, and the like; acetamide solvents such as N,N-dimethyl acetamide, N,N-diethyl acetamide, and the like; pyrrolidone solvents such as N-methyl-2-pyrrolidone, N-vinyl-2-pyrrolidone, and the like; phenolic solvents such as phenol, o-, m-, or p-cresol, xylenol, phenol halide, catechol, and the like; hexamethylphosphoramide; γ-butyrolactone; and the like. Further, according to need, it is possible to use, in combination, such organic polarity solvents and aromatic hydrocarbon such as xylene, toluene, or the like.

Further, for example, it is also possible to use a solvent exemplified by symmetric glycol diethers such as methyl-monoglyme(1,2-dimethoxy ethane), methyldiglyme(bis(2-methoxy ethyl)ether), methyltriglyme(1,2-bis(2-methoxy-ethoxy)ethane), methyltetraglyme(bis[2-(2-methoxyethoxyethyl)]ether), ethylmonoglyme(1,2-diethoxyethane), ethyldiglyme(bis(2-ethoxyethyl)ether), butyldiglyme(bis(2-butoxyethyl)ether), and the like; acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, acetic acid 2-(2-butoxy ethoxy)ethyl)), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, 1,3-butylene glycol diacetate, and the like; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether, and the like. Of these solvents, it is preferable to use a symmetric glycol diether, which is less likely to cause a secondary reaction.

It is desirable that an amount in which a solvent is used during the reaction be set so that a reaction solution has a solute weight concentration, i.e., a solution concentration of not less than 5 wt % and not more than 90 wt %. It is more desirable that the reaction solution have a solution concentration preferably of not less than 10 wt % and not more than 80 wt %. The reaction solution which has a solution concentration of less than 5 wt % is not preferable since (i) a polymerization reaction is not easily initiated and thus a reaction rate is slow in such a reaction solution and (ii) a desired structured material would not be obtained.

In a case where a terminal functional group of the compound thus obtained is an isocyanate group, it is possible to block a terminal isocyanate group with a compound which may be, but not limited to, a compound having a hydroxyl group, a carboxyl group, an acid anhydride group, an amine group, an amino group, an urethane group, an urea group, a mercapto group an imidazole group, an imine group, oxime group, a lactam group, or the like. Such a compound is preferable since the compound can prevent a variation with time of a solution by blocking a terminal isocyanate group.

<(a) Diisocyanate Compound>

(a) The diisocyanate compound of the present invention is a compound which contains two isocyanate groups in its molecule.

For example, (a) the diisocyanate compound is exemplified by aromatic diisocyanate compounds such as diphenylmethane-2,4'-diisocyanate, 3,2'-, 3,3'-, 4,2'-, 4,3'-, 5,2'-, 5,3'-, 6,2'-, or 6,3'-dimethyl diphenylmethane-2,4'-diisocyanate, 3,2'-, 3,3'-, 4,2'-, 4,3'-, 5,2'-, 5,3'-, 6,2'-, or 6,3'-diethyl diphenylmethane-2,4'-diisocyanate, 3,2'-, 3,3'-, 4,2'-, 4,3'-, 5,2'-, 5,3'-, 6,2'-, or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenyl ether-4,4'-diisocyanate, benzophenone-4,4'-diisocyanate, diphenyl sulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, 4,4'[2,2-bis(4-phenoxyphenyl)propane]diisocyanate, and the like; alicyclic diisocyanate compounds such as hydrogenated diphenylmethane diisocyanate, hydrogenated xylylene diisocyanate, isophorone diisocyanate, norbornene diisocyanate, and the like; aliphatic diisocyanate compounds such as hexamethylene diisocyanate, trimethyl hexamethylene diisocyanate, lysine diisocyanate, and the like; and the like. These compounds can be used alone or in combination of two or more kinds. It is preferable to use such a compound from the viewpoint of enhancement of heat resistance of a cured film to be obtained.

It is particularly preferable to use, as the diisocyanate compound, diphenylmethane-4,4'-diisocyanate, diphenylmethane-3,3'-diisocyanate, diphenylmethane-3,4'-diisocyanate, tolylene-2,4-diisocyanate, tolylene-2,6-diisocyanate, or norbornene diisocyanate. It is preferable to use such a compound from the viewpoint of further enhancement of heat resistance and water resistance of a cured film to be obtained.

In order to enhance developing property of the photosensitive resin composition, tolylene-2,6-diisocyanate, tolylene- 2,4-diisocyanate, or 1,6-hexamethylene diisocyanate is preferably used as the diisocyanate compound.

Further, from the viewpoint of further enhancement of plasticity, flexibility, and mechanical strength of a cured film to be obtained, it is also preferable to use a terminal isocyanate compound obtained by reacting (a) the diisocyanate compound and (b) the diol compound together.

<(b) Diol Compound>

(b) The diol compound of the present invention is a compound which contains two hydroxyl groups in its molecule and is branched or linear.

For example, (b) the diol compound is exemplified by, but not particularly limited to alkylenediols such as ethylene glycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl1, 8-octanediol, 1,9-nonanediol, 1,10-decanediol, 1,4-cyclohexanediol, 1,4-cyclohexanedimethanol, and the like; carboxyl group-containing diols such as dimethylol propionate (2,2-bis(hydroxymethyl)propionate), dimethylol butanoic acid(2,2-bis(hydroxymethyl)butanoic acid), 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, and the like; polyoxyalkylenediols such as polyethylene glycol, polypropylene glycol, polytetramethylene glycol, a random copolymer of tetramethylene glycol and neopentyl glycol, and the like; polyester diols obtained by reacting polyhydric alcohol and polybasic acid together; polycarbonate diols having a carbonate skeleton; polycaprolactone diols obtained by a ring-opening addition reaction of a lactone such as γ-butyl lactone, ∈-caprolactone, δ-valerolactone, or the like; bisphenol-A; an ethylene oxide adduct of bisphenol-A; a propylene oxide adduct of bisphenol-A; hydrogenated bisphenol-A; an ethylene oxide adduct of hydrogenated bisphenol-A; a propylene oxide adduct of hydrogenated bisphenol-A; and the like. These diol compounds can be used alone or in combination of two or more kinds.

It is particularly preferable to use a polycarbonate diol as (b) the diol compound. It is preferable to use the polycarbonate diol from the viewpoint of further enhancement of heat resistance, plasticity, water resistance, chemical resistance, and electric insulation reliability at high temperature and humidity of a cured film to be obtained.

For example, the polycarbonate diol is more specifically exemplified by commercially available polycarbonate diols such as PCDL T-4671, T-4672, T-4691, T-4692, T-5650J, T-5651, T-5652, T-6001, and T-6002 (trade names) manufactured by Asahi Kasei Chemicals Corporation; Placcel CD CD205, CD205PL, CD205HL, CD210, CD210PL, CD210HL, CD220, CD220PL, and CD220HL (trade names) manufactured by Daicel Chemical Industries, Ltd.; Kuraray Polyol C-1015N, C-1050, C-1065N, C-1090, C-2015N, C-2065N, and C-2090 (trade names) manufactured by KURARAY CO., LTD.; and Nippollan 981, 980R, and 982R (trade names) manufactured by Nippon Polyurethane Industry Co., Ltd. These polycarbonate diols can be used alone or in combination of two or more kinds. The polycarbonate diol has a number average molecular weight preferably of 500 to 5000, more preferably of 750 to 2500, and particularly preferably of 1000 to 2000, based on polystyrene. The polycarbonate diol which has a number average molecular weight falling within the above range is preferable from the viewpoint of enhancement of chemical resistance and plasticity of a cured film to be obtained. The polycarbonate diol which has a number average molecular weight of less than 500 may cause deterioration in plasticity of a cured film to be obtained.

The polycarbonate diol which has a number average molecular weight of more than 5000 may cause deterioration in solvent solubility of a resin which contains substantially no photosensitive group and contains a urethane bond(s).

The polycarbonate diol is exemplified by not only the above polycarbonate diols but also various kinds of monomers. A monomer to be used is not limited in number and kind provided that the monomer is polymerizable and prevents loss of a physical property of the photosensitive resin composition.

It is preferable that (i1) the resin of the present invention which resin contains no unsaturated double bond in its molecule and contains a urethane bond(s) in its molecule be contained in the photosensitive resin composition in 1 part by weight to 50 parts by weight, preferably in 10 parts by weight to 40 parts by weight, and particularly preferably in 20 parts by weight to 30 parts by weight, with respect to 100 parts by weight of the photosensitive resin composition.

<(i2) Resin Containing Unsaturated Double Bond(s) in Molecule and Containing Urethane Bond in Molecule>

(i2) The resin of the present invention which resin contains an unsaturated double bond(s) in its molecule and contains a urethane bond(s) in its molecule is not particularly limited provided that the resin is a urethane-modified acrylic (meth)acrylic) resin or the like which (i) contains at least one urethane bond in its molecule and (ii) contains at least one unsaturated double bond in its molecule. For example, (i2) the resin of the present invention which resin contains an unsaturated double bond(s) in its molecule and contains a urethane bond(s) in its molecule is obtained by reacting (c) a hydroxyl group-containing (meth)acrylate and (d) an isocyanate compound together.

<(c) Hydroxyl Group-Containing (Meth)Acrylate>

(c) The hydroxyl group-containing (meth)acrylate of the present invention is a compound which contains, in its molecule, (i) at least one hydroxyl group and (ii) at least one unsaturated double bond and is branched or linear.

For example, (c) the hydroxyl group-containing (meth)acrylate is exemplified by 2-hydroxyethyl(meth)acrylate, polyethylene oxide mono(meth)acrylate, polypropylene oxide mono(meth)acrylate, polyalkylene oxide mono(meth)acrylate, poly(∈-caprolactone)mono(meth)acrylate, 2-hydroxypropyl(meth)acrylate, 4-hydroxybutyl(meth)acrylate, 3-hydroxy-2,2-dimethylpropyl(meth)acrylate, hydroxypropyl(meth)acrylate, 2-hydroxy-3-phenoxypropyl acrylate, mono, di, or tetraacrylate containing a hydroxyl group of polyhydric alcohol (e.g., trimethylolpropane, glycerol, pentaerythritol, and dipentaerythritol; and trimethylolpropane, glycerol, pentaerythritol, and dipentaerythritol each ethoxylated, propoxylated, or alkoxylated), 2-hydroxyethyl acrylate, hydroxypropyl acrylate, 4-hydroxybutyl acrylate, poly(∈-caprolactone)mono(meth)acrylate, and the like. These hydroxyl group-containing (meth)acrylates can be used alone or in combination of two or more kinds. It is preferable to use such a hydroxyl group-containing (meth)acrylate from the viewpoint of enhancement of heat resistance of a cured film to be obtained.

<(d) Isocyanate Compound>

(d) The isocyanate compound of the present invention is a compound which contains at least one isocyanate group in its molecule and is branched or linear.

For example, (d) the isocyanate is exemplified by butylene diisocyanate, hexamethylene diisocyanate (HDI), isophorone diisocyanate (IPDI), 1,8-diisocyanate-4-(isocyanato methyl) octane, 2,2,4- and/ or 2,4,4-trimethyl hexamethylene diisocyanate, isocyanato methyl-1,8-octane diisocyanate, 1,4-cyclohexylene diisocyanate, isomer cyclohexane dimethylene diisocyanate, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, triphenylmethane-4,4',4"-triisocyanate, and tris(p-isocyanato phenyl)thiophosphate; and derivatives of these isocyanates, the derivatives each having an urethane, urea, carbodiimide, acyl urea, isocyanurate, allophanate, biuret, oxadiazine trione, uretdione, or imino oxadiazine dione structure; and the like. These isocyanate compounds can be used alone or in combination of two or more kinds. It is preferable to use such an isocyanate compound from the viewpoint of enhancement of heat resistance of a cured film to be obtained.

Further, (i) a compound which contains two or more hydroxy groups in its molecule as in the case of (b) the diol compound and (ii) an epoxy (meth)acrylate or an acrylated polyacrylate which contains a hydroxy group and has an acid value of acid value of 20 mgKOH/g to 300 mgKOH/g can be used alone or in combination of two or more kinds for a polymerization reaction. It is preferable to use these compounds from the viewpoint of enhancement of plasticity, heat resistance, and mechanical properties of a cured film to be obtained.

[Other Components]

According to need, the photosensitive resin composition of the present invention can further contain additives such as a flame retardant, a coloring agent, an adhesive improver, a polymerization inhibitor, a solvent, and the like. The photosensitive resin composition of the present invention may also contain a thermosetting resin according to need.

The thermosetting resin of the present invention is a compound which forms a cross-linked structure at heating and functions as a heat curing agent. For example, a usable thermosetting resin is exemplified by thermosetting resins such as epoxy resin, bismaleimide resin, bis-allyl-nadi-imide resin, acrylic resin, methacryl resin, hydrosilyl cured resin, allyl cured resin, unsaturated polyester resin, and the like; reactive side-chain group-containing thermosetting polymers each having, in a side chain or at an end of a polymeric chain, a reactive group such as an allyl group, a vinyl group, an alkoxysilyl group, a hydrosilyl group, or the like; and the like. The above thermosetting components may be used alone, or two or more of the thermosetting components may be used in combination. Of these thermosetting components, it is more preferable to use epoxy resin as the thermosetting resin. In a case where the thermosetting resin contains an epoxy resin component, a cured film to be obtained by curing the photosensitive resin composition can be provided with (i) heat resistance and (ii) adhesiveness to a conductor such as metal foil and to a circuit board. The epoxy resin is a compound which contains at least two epoxy groups in its molecule. For example, a bisphenol-A epoxy resin is exemplified by jER828, jER1001, and jER1002 (trade names) manufactured by Japan Epoxy Resins Co. Ltd.; ADEKA RESIN EP-4100E and ADEKA RESIN EP-4300E (trade names) manufactured by ADEKA CORPORATION; RE-310S and RE-410S (trade names) manufactured by Nippon Kayaku Co., Ltd.; EPICLON 840S, EPICLON 850S, EPICLON 1050, and EPICLON 7050 (trade names) manufactured by DIC Corporation; and Epo Tohto YD-115, Epo Tohto YD-127, and Epo Tohto YD-128 (trade names) manufactured by Tohto Kasei Co., Ltd. A bisphenol F epoxy resin is exemplified by jER806 and jER807 (trade names) manufactured by Japan Epoxy Resins Co. Ltd.; ADEKA RESIN EP-4901E, ADEKA RESIN EP-4930, and ADEKA RESIN EP-4950 (trade names) manufactured by ADEKA CORPORATION; RE-303S, RE-304S, RE-403S, and RE-404S (trade names) manufactured by Nippon Kayaku Co., Ltd.; EPICLON 830 and EPICLON 835 (trade names) manufactured by DIC Corporation; and Epo Tohto YDF-170, Epo Tohto YDF-175S, and Epo Tohto YDF-2001 (trade names) manufactured by Tohto Kasei Co., Ltd. A bisphenol S epoxy resin is exemplified by EPICLON EXA-1514 (trade name) manufactured by DIC Corporation. A hydrogenated bisphenol-A epoxy resin is exemplified by jERYX8000, jERYX8034, and jERYL7170 (trade names) manufactured by Japan Epoxy Resins Co. Ltd.; ADEKA RESIN EP-4080E (trade name) manufactured by ADEKA CORPORATION; EPICLON EXA-7015 (trade name) manufactured by DIC Corporation; and Epo Tohto YD-3000 and Epo Tohto YD-4000D (trade names) manufactured by Tohto Kasei Co., Ltd. A biphenyl epoxy resin is exemplified by jERYX4000, jERYL6121H, jERYL6640, and jERYL6677 (trade names) manufactured by Japan Epoxy Resins Co. Ltd.; and NC-3000 and NC-3000H (trade names) manufactured by Nippon Kayaku Co., Ltd. A phenoxy epoxy resin is exemplified by jER1256, jER4250, and jER4275 (trade names) manufactured by Japan Epoxy Resins Co. Ltd. A naphthalene epoxy resin is exemplified by EPICLON HP-4032, EPICLON HP-4700, and EPICLON HP-4200 (trade names) manufactured by DIC Corporation; and NC-7000L (trade name) manufactured by Nippon Kayaku Co., Ltd. A phenol novolac epoxy resin is exemplified by jER152 and jER154 (trade names) manufactured by Japan Epoxy Resins Co. Ltd.; EPPN-201-L (trade name) manufactured by Nippon Kayaku Co., Ltd.; EPICLON N-740 and EPICLON N-770 (trade names) manufactured by DIC Corporation; and Epo Tohto YDPN-638 (trade name) manufactured by Tohto Kasei Co., Ltd. A cresol novolac epoxy resin is exemplified by EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by DIC Corporation. A trisphenol methane epoxy resin is exemplified by EPPN-501H, EPPN-501HY, and EPPN-502H (trade names) manufactured by Nippon Kayaku Co., Ltd. A dicyclopentadiene epoxy resin is exemplified by XD-1000 (trade name) manufactured by Nippon Kayaku Co., Ltd.; and EPICLON HP-7200 (trade name) manufactured by DIC Corporation. An amine epoxy resin is exemplified by Epo Tohto YH-434 and Epo Tohto YH-434L (trade names) manufactured by Tohto Kasei Co., Ltd. A flexible epoxy resin is exemplified by jER871, jER872, jERYL7175, and jERYL7217 (trade names) manufactured by Japan Epoxy Resins Co. Ltd.; and EPICLON EXA-4850 (trade name) manufactured by DIC Corporation. An urethane-modified epoxy resin is exemplified by ADEKA RESIN EPU-6, ADEKA RESIN EPU-73, and ADEKA RESIN EPU-78-11 (trade names) manufactured by ADEKA CORPORATION. A rubber-modified epoxy resin is exemplified by ADEKA RESIN EPR-4023, ADEKA RESIN EPR-4026, and ADEKA RESIN EPR-1309 (trade names) manufactured by ADEKA CORPORATION. A chelate-modified epoxy resin is exemplified by ADEKA RESIN EP-49-10 and ADEKA RESIN EP-49-20 (trade names) manufactured by ADEKA CORPORATION; and the like.

A curing agent for the thermosetting resin of the present invention is not particularly limited. For example, the curing agent is exemplified by phenol resins such as phenol novolac resin, cresol novolac resin, naphthalene phenol resin, and the like, amino resin, urea resin, melamine, dicyandiamide, and the like. These curing agents can be used alone or in combination of two or more kinds.

For example, a curing accelerator is exemplified by, but not particularly limited to phosphine compounds such as triphenylphosphine and the like; amine compounds such as a tertiary amine, trimethanolamine, triethanolamine, tetraethanolamine, and the like; borate compounds such as 1,8-diazabicyclo[5,4,0]-7-undecenium tetraphenyl borate and the like; and the like; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, 2-phenyl-4-methylimidazole, and the like; imidazolines such as 2-methylimidazoline, 2-ethylimidazoline, 2-isopropylimidazoline, 2-phenylimidazoline, 2-undecylimidazoline, 2,4-dimethylimidazoline, 2-phenyl-4-methylimidazoline, and the like; azine imidazoles such as 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1)]-ethyl-s-triazine, and the like; and the like. These curing accelerators can be used alone or in combination of two or more kinds.

The photosensitive resin composition contains a thermosetting resin component of the present invention preferably in 0.5 part by weight to 100 parts by weight, more preferably in 1 part by weight to 50 parts by weight, and particularly preferably in 5 parts by weight to 20 parts by weight, with respect to 100 parts by weight of components of the photosensitive resin composition. In a case where an amount of the thermosetting resin component is adjusted to fall within the above range, (C) the photosensitive resin composition cured film can improve in heat resistance, chemical resistance, and electric insulation reliability. Therefore, the thermosetting resin component whose amount is adjusted to fall within the above range is preferable.

In a case where the photosensitive resin composition contains the thermosetting resin component in an amount falling below the above range, (C) the photosensitive resin composition cured film may be inferior in heat resistance and electric insulation reliability. In a case where the photosensitive resin composition contains the thermosetting resin component in an amount exceeding the above range, (C) the photosensitive resin composition cured film may be fragile, inferior in plasticity, and large in warpage.

A pattern made of (C) the photosensitive resin composition cured film of the present invention is excellent in heat resistance, flame retardancy, and electrical and mechanical properties, particularly in plasticity. For example, an insulating film of the present invention has a thickness preferably of approximately 2 μm to 50 μm, and has a resolution of at least up to 10 μm, and particularly of approximately 10 μm to 1000 μm after photocuring. Therefore, the insulating film of the present invention is particularly suitable as an insulating material of a high density flexible printed circuit board.

The flame retardant of the present invention refers to a compound which is used to flame-retard a photosensitive resin composition. For example, a usable flame retardant is exemplified by a phosphoric ester compound, a halogen-containing compound, a metal hydroxide, an organic phosphorus compound, silicone, and the like. The flame retardant can be used as an additive flame retardant or a reactive flame retardant. The above flame retardants may be used alone, or two or more of the flame retardants may be used in combination. Of these flame retardants, from the viewpoint of environmental contamination, it is more preferable to use a non-halogen compound, and it is particularly preferable to use a phosphorous flame retardant. It is preferable that the photosensitive resin composition of the present invention contain a flame retardant component in 1 part by weight to 100 parts by weight with respect to 100 parts by weight of a total of components (e.g., the (E) component, the (F) component, the (G) component, and the (H) component, or the (E) component, the (F) component, the (G) component, the (H) component, and the (I) component) of the photosensitive resin composition other than the flame retardant component. The photosensitive resin composition which contains the flame retardant component in the above ratio is preferable since the photosensitive resin composition of the present invention allows enhancement of flame retardancy without losing its developing property and photosensitivity, and bending resistance of a cured film to be obtained. In a case where the photosensitive resin composition contains the flame retardant component in an amount falling below the above range, (C) the photosensitive resin composition cured film may have insufficient flame retardancy. In a case where the photosensitive resin composition contains the flame retardant component in an amount exceeding the above range, the photosensitive resin composition may have a lower developing property and lower photosensitivity.

The coloring agent of the present invention is exemplified by a phthalocyanine compound, an azo compound, carbon black, and a titanium oxide. The adhesive improver is exemplified by a silane coupling agent, a triazole compound, a tetrazole compound, and a triazine compound. The polymerization inhibitor is exemplified by hydroquinone, hydroquinone monomethyl ether, and the like. These coloring agents, adhesive improvers, and polymerization inhibitors can be used alone or in combination of two or more kinds. In order to enhance adhesiveness and a hardness of a cured film, the photosensitive resin composition of the present invention may further contain an inorganic filler. For example, the inorganic filler is exemplified by, but not particularly limited to barium sulfate, barium titanate, talc, ultrafine particle anhydrous silica, synthetic silica, natural silica, calcium carbonate, magnesium carbonate, aluminum oxide, and the like. These inorganic fillers can be used alone or in combination of two or more kinds.

The solvent of the present invention may be a solvent which can dissolve the photosensitive resin composition (i.e., the (E) to (I) components). For example, the solvent is exemplified by sulfoxide solvents such as dimethyl sulfoxide, diethyl sulfoxide, and the like; symmetric glycol diethers such as methylmonoglyme(1,2-dimethoxy ethane), methyldiglyme(bis(2-methoxy ethyl)ether), methyltriglyme(1,2-bis(2-methoxyethoxy)ethane), methyltetraglyme(bis[2-(2-methoxyethoxyethyl)]ether), ethylmonoglyme(1,2-diethoxyethane), ethyldiglyme(bis(2-ethoxyethyl)ether), butyldiglyme(bis(2-butoxyethyl)ether), and the like; acetates such as γ-butyrolactone, methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: Carbitol acetate, acetic acid 2-(2-butoxy ethoxy) ethyl)), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, 1,3-butylene glycol diacetate, and the like; and ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripropylene glycol n-propyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether, and the like. These solvents can be used alone or in combination of two or more kinds.

It is preferable that the photosensitive resin composition contain the solvent preferably in 10 parts by weight to 400 parts by weight, more preferably in 20 parts by weight to 200 parts by weight, and particularly preferably in 40 parts by weight to 100 parts by weight, with respect to 100 parts by weight of a total of components (e.g., the (E) component, the (F) component, the (G) component, and the (H) component, or the (E) component, the (F) component, the (G) component, the (H) component, and the (I) component) of the photosensitive resin composition other than the solvent. In a case where an amount of the solvent is adjusted to fall within the above range, it is possible to adjust viscosity or a viscous property of the photosensitive resin composition to fall within a range which is suitable for coating such as screen printing or the like. Therefore, the solvent whose amount is adjusted to fall within the above range is preferable. In a case where the photosensitive resin composition contains the solvent in an amount falling below the above range, the photosensitive resin composition has extremely high viscosity, coating is difficult to carry out with respect to the photosensitive resin composition, bubble inclusions occur in the photosensitive resin composition during coating, and the photosensitive resin composition may be inferior in levelling property. In a case where the photosensitive resin composition contains the solvent in an amount exceeding the above range, the photosensitive resin composition has extremely low viscosity, coating is difficult to carry out with respect to the photosensitive resin composition, and the photosensitive resin composition may be inferior in circuit covering property.

The photosensitive resin composition of the present invention can be obtained by uniformly mixing the (E) component, the (F) component, the (G) component, the (H) component, the (I) component, and the other components. For example, a general kneading device such as a three-roll device, a beads-mill device, or the like may be used for the uniform mixing. In a case where a solution has low viscosity, a general stirring device may also be used for the mixing.

According to photosensitive resin composition of the present invention, a pattern can be formed as below. First, the photosensitive resin composition is applied to a substrate. Then, the photosensitive resin composition is dried so that a solvent is removed therefrom. The photosensitive resin composition can be applied to the substrate by screen printing, roller coating, curtain coating, spray coating, rotational application by use of a spinner, or the like. A coating film (having a thickness preferably of 5 μm to 100 μm) is dried at a temperature of not more than 120° C., and preferably of 40° C. to 100° C. After the drying, a negative photolithographic mask is provided on the coating film and then dried, and the film is irradiated with activating light such as ultraviolet light, a visible light ray, an electron ray, or the like. Then, a pattern can be obtained by rinsing an unexposed part of the film with a developer by use of various methods such as uses of a shower, a paddle, immersion, ultrasonic waves, and the like. Note that it is preferable to appropriately find an optimum device condition since a time which is required for exposure of a pattern varies depending on a spray pressure and a flow rate of a developing device, and a temperature of a developer. It is preferable to use an alkaline aqueous solution as the developer. The developer may contain a water-soluble organic solvent such as methanol, ethanol, n-propanol, iso-propanol, N-methyl-2-pyrrolidone, or the like. For example, an alkaline compound which constitutes the alkaline aqueous solution is exemplified by a hydroxide, a carbonate, and a hydrogencarbonate of an alkali metal, an alkali earth metal, or an ammonium ion; an amine compound; and the like. Specifically, the alkaline compound is exemplified by sodium hydroxide, potassium hydroxide, ammonium hydroxide, sodium carbonate, potassium carbonate, ammonium carbonate, sodium hydrogen carbonate, potassium hydrogen carbonate, ammonium hydrogen carbonate, tetramethylammonium hydroxyde, tetraethylammonium hydroxyde, tetrapropylammonium hydroxyde, tetraisopropylammonium hydroxyde, N-methyl diethanolamine, N-ethyl diethanolamine, N,N-dimethyl ethanolamine, triethanolamine, triisopropanolamine, triisopropylamine, and the like. It is also possible to use a compound other than these alkaline compounds provided that the compound allows an aqueous solution to be basic.

It is preferable that the alkaline compound which can be suitably used for a development process for developing the photosensitive resin composition of the present invention have a concentration preferably of 0.01 wt % to 10 wt %, and particularly preferably of 0.05 wt % to 5 wt %. Note that the developer, whose temperature depends on a composition of the photosensitive resin composition and/or a composition of the developer, is preferably used at a temperature generally of not less than 0° C. and not more than 80° C., and more generally of not less than 20° C. and not more than 50° C.

A pattern formed by the development process is rinsed so as to remove an unnecessary residual of the developer. A rinse agent is exemplified by water, an acidic aqueous solution, and the like.

Next, a cured film which is rich in heat resistance and plasticity can be obtained by carrying out a heat curing process. The cured film, which is determined in view of a wire thickness and the like, preferably has a thickness of approximately 2 μm to 50 μm. It is desirable that a final curing temperature of the heat curing process be a low temperature so as to prevent (i) oxidation of a wire and the like and (ii) deterioration in adhesiveness between a wire and a base material. In this case, heat curing is desirably carried out at a temperature preferably of not less than 100° C. and not more than 250° C., more preferably of not less than 120° C. and not more than 200° C., and particularly preferably of not less than 130° C. and not more than 190° C. In a case where a final heating temperature rises, deterioration in wire by oxidation may progress.

Another embodiment of the present invention can be described as below.

As a result of diligently carrying out research so as to attain the object, the inventors of the present invention found that, in a case where a stiffener-integrated flexible printed circuit board has a structure in which (A) a stiffener, (B) a bonding material, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule, reflow heat resistance is secured even though a stiffener is attached to (C') the photosensitive resin composition.

Similarly, the inventors of the present invention found that, in a case where a stiffener-integrated flexible printed circuit board has a structure in which (A) a stiffener, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule, reflow heat resistance is secured even though a stiffener is attached to (C') the photosensitive resin composition.

Namely, a stiffener-integrated flexible printed circuit board in accordance with the present invention has a structure in which (A) a stiffener, (B) a bonding material, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule. It is preferable that an epoxy group in (E) the epoxy resin is 1.0 time to 1.8 times greater in mole than a carboxyl group of (F) the carboxyl group-containing resin which contains substantially no photosensitive group in its molecule. Further, it is preferable that (C') the photosensitive resin composition contain (G) an unsaturated double bond-containing resin and (H) a photopolymerization initiator.

A stiffener-integrated flexible printed circuit board in accordance with the present invention has a structure in which (A) a stiffener, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule. It is preferable that an epoxy group in (E) the epoxy resin is 1.0 time to 1.8 times greater in mole than a carboxyl group of (F) the carboxyl group-containing resin which contains substantially no photosensitive group in its molecule. Further, it is preferable that (C') the photosensitive resin composition contain (G) an unsaturated double bond-containing resin and (H) a photopolymerization initiator.

A method in accordance with the present invention for manufacturing a stiffener-integrated flexible printed circuit board, includes the step of: laminating (B) a bonding material and (A) a stiffener in this order on a photosensitive resin composition cured film obtained by applying (C') a photosensitive resin composition to (D) a flexible printed circuit board and curing (C') the photosensitive resin composition, (C') the photosensitive resin composition containing (E) an epoxy resin and (F) a carboxyl group-containing resin which contains substantially no photosensitive group in its molecule. It is preferable that an epoxy group in (E) the epoxy resin is 1.0 time to 1.8 times greater in mole than a carboxyl group of (F) the carboxyl group-containing resin which contains substantially no photosensitive group in its molecule. Further, it is preferable that (C') the photosensitive resin composition contain (G) an unsaturated double bond-containing resin and (H) a photopolymerization initiator.

A method in accordance with the present invention for manufacturing a stiffener-integrated flexible printed circuit board, includes the step of: laminating (A) a stiffener on a photosensitive resin composition cured film obtained by applying (C') a photosensitive resin composition to (D) a flexible printed circuit board and curing (C') the photosensitive resin composition, (C') the photosensitive resin composition containing (E) an epoxy resin and (F) a carboxyl group-containing resin which contains substantially no photosensitive group in its molecule. It is preferable that an epoxy group in (E) the epoxy resin is 1.0 time to 1.8 times greater in mole than a carboxyl group of (F) the carboxyl group-containing resin which contains substantially no photosensitive group in its molecule. Further, it is preferable that (C') the photosensitive resin composition contain (G) an unsaturated double bond-containing resin and (H) a photopolymerization initiator.

As described earlier, the present invention, which is a stiffener-integrated flexible printed circuit board having a structure in which (A) a stiffener, (B) a bonding material, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule, yields an effect such that a defect such as a blistering is not generated during a reflow process even though a stiffener is attached to a photosensitive resin composition.

Similarly, the present invention, which is a stiffener-integrated flexible printed circuit board having a structure in which (A) a stiffener, (C') a photosensitive resin composition, and (D) a flexible printed circuit board are laminated in this order, (C') the photosensitive resin composition containing (E) an epoxy resin and (F) a carboxyl group-containing resin which contains substantially no photosensitive group in its molecule, yields an effect such that a defect such as a blistering is not generated during a reflow process even though a stiffener is attached to a photosensitive resin composition.

A further embodiment of the present invention can be described as below. The description of the present embodiment can appropriately quote the description of the first embodiment and the second embodiment.

As a result of diligently carrying out research so as to attain the object, the inventors of the present invention found that, in a case where a stiffener-integrated flexible printed circuit board has a structure in which (A) a stiffener, (B) a bonding material, (C') a photosensitive resin composition, and (D) a flexible printed circuit board are laminated in this order, (C') the photosensitive resin composition containing at least (I) a compound which contains a urethane bond(s), reflow heat resistance is secured even though a stiffener is attached to the photosensitive resin composition.

Namely, a stiffener-integrated flexible printed circuit board in accordance with the present invention has a structure in which (A) a stiffener, (B) a bonding material, (C') a photosensitive resin composition, and (D) a flexible printed circuit board are laminated in this order, (C') the photosensitive resin composition containing at least (I) a compound which contains a urethane bond(s).

The stiffener-integrated flexible printed circuit board in accordance with the present invention is arranged such that (C') the photosensitive resin composition contains (i1) a resin which contains no unsaturated double bond in its molecule and contains a urethane bond(s) in its molecule.

Alternatively, the stiffener-integrated flexible printed circuit board in accordance with the present invention is arranged such that (C') the photosensitive resin composition contains (i2) a resin which contains an unsaturated double bond(s) in its molecule and contains a urethane bond(s) in its molecule.

Alternatively, the stiffener-integrated flexible printed circuit board in accordance with the present invention is arranged such that (C') the photosensitive resin composition contains (i1) and (i2).

It is preferable that (C') the photosensitive resin composition further contain (H) a photopolymerization initiator.

A method in accordance with the present invention for manufacturing a stiffener-integrated flexible printed circuit board, includes the step of: laminating (B) a bonding material and (A) a stiffener in this order on a photosensitive resin composition cured film obtained by applying, to (D) a flexible printed circuit board, (C') a photosensitive resin composition containing at least (I) a compound which contains a urethane bond(s), and curing (C') the photosensitive resin composition.

As described earlier, the present invention, which is a stiffener-integrated flexible printed circuit board having a structure in which (A) a stiffener, (B) a bonding material, (C') a photosensitive resin composition, and (D) a flexible printed circuit board are laminated in this order, (C') the photosensitive resin composition containing at least (I) a compound which contains a urethane bond(s), yields an effect such that a defect such as a blistering is not generated during a reflow process even though a stiffener is attached to a photosensitive resin composition.

The present invention is not limited to the description of the embodiments above, but may be altered by a skilled person within the scope of the claims. An embodiment based on a proper combination of technical means disclosed in different embodiments is encompassed in the technical scope of the present invention.

EXAMPLES

The following description more specifically describes the present invention with reference to Examples. However, the present invention is not limited by the Examples.

(1) Experiment 1

Synthesis Example 1

<Synthesis of (F) Carboxyl Group-Containing Resin Containing Substantially No Photosensitive Group in Molecule>

100.0 g of methyltriglyme (=1,2-bis(2-methoxyethoxy)ethane) was poured, as a solvent for polymerization, into a reaction container provided with a stirrer, a thermometer, a dropping funnel, and a nitrogen inlet tube, and heated to 80° C. under stirring in nitrogen gas stream. 12.0 g (0.14 mole) of methacrylic acid, 28.0 g (0.16 mole) of benzyl methacrylate, 60.0 g (0.42 mole) of butyl methacrylate, and 0.5 g of azobisisobutyronitrile as a radical polymerization initiator which had been mixed in advance at a room temperature were dropped from the dropping funnel to the methyltriglyme over three hours with their temperature maintained at 80° C. After the dropping, a reaction solution was heated to 90° C. under stirring, and the reaction solution was further stirred for another two hours while being maintained at 90° C., whereby a solution of (F) a carboxyl group-containing resin which contains substantially no photosensitive group in its molecule was obtained (F-1). The carboxyl group-containing resin solution thus obtained had a solid concentration of 48%, a weight average molecular weight of 48,000, and an acid value of 78 mgKOH/g. Note that the solid concentration, the weight average molecular weight, and the acid value were measured by the following method.

<Measurement of Weight Average Molecular Weight>

A weight average molecular weight of (F) the synthesized carboxyl group-containing resin which contains substantially no photosensitive group in its molecule was measured under the following condition.

Used device: counterpart of HLC-8220GPC manufactured by TOSOH CORPORATION
Column: TSK gel Super AWM-H (6.0 mml. D.×15 cm) manufactured by TOSOH CORPORATION×2
Guard column: TSK guard column Super AW-H manufactured by TOSOH CORPORATION
Eluent: 30 mM LiBr+20 mM H3PO4 in DMF
Flow rate: 0.6 mL/min
Column temperature: 40° C.
Detection condition: R1: polarity (+), response (0.5 sec)
Sample concentration: approximately 5 mg/mL
Standard sample: PEG (polyethylene glycol)

<Measurement of Acid Value>

An acid value of (F) the synthesized carboxyl group-containing resin which contains substantially no photosensitive group in its molecule was measured in accordance with JIS K 5601-2-1.

Examples 1 through 7

<Preparation of Photosensitive Resin Composition>

A photosensitive resin composition was prepared by adding (F) the carboxyl group-containing resin which contained substantially no photosensitive group in its molecule and was obtained in Synthesis Example 1, (E) an epoxy resin, (G) an unsaturated double bond-containing resin, (H) a photopolymerization initiator, and other components. Table 1 shows (i) amounts in which the above raw materials of the photosensitive resin composition are mixed in a resin solid content and (ii) kinds of the raw materials. Note that 1,2-bis(2-methoxyethoxy)ethane, which is a solvent shown in Table 1, indicates a total amount of a solvent including a solvent and the like which are contained in, for example, the resin solution synthesized in Synthesis Example 1. A mixed solution was completely defoamed in a defoaming device, and the following evaluation was carried out.

TABLE 1

| | | Unit: parts by weight | | | | | | |
|---|---|---|---|---|---|---|---|---|
| Component | Raw material | Ex. 1 | Ex. 2 | Ex. 3 | Ex. 4 | Ex. 5 | Ex. 6 | Ex. 7 |
| E component | jER630[1] | 8.5 | 10.0 | 15.0 | 5.0 | 20.0 | — | — |
| | EPICLON N-665[2] | — | — | — | — | — | 17.0 | 20.0 |
| F component | F-1 | 60.0 | 60.0 | 60.0 | 60.0 | 60.0 | 60.0 | 60.0 |
| G component | A-9300[3] | 4.0 | 4.0 | 4.0 | 4.0 | 4.0 | 4.0 | 4.0 |
| | BPE-1300[4] | 10.0 | 10.0 | 10.0 | 10.0 | 10.0 | 10.0 | 10.0 |
| H component | IRGACURE819[5] | 5.0 | 5.0 | 5.0 | 5.0 | 5.0 | 5.0 | 5.0 |
| Other components | SPB-100[6] | 10.0 | 10.0 | 10.0 | 10.0 | 10.0 | 10.0 | 10.0 |
| | AEROSIL R-974[7] | 1.0 | 1.0 | 1.0 | 1.0 | 1.0 | 1.0 | 1.0 |
| | 1,2-bis(2-methoxyethoxy)ethane | 42.2 | 42.2 | 42.2 | 42.2 | 42.2 | 42.2 | 42.2 |
| | Number of moles of epoxy group containing E component/number of moles of carboxyl group containing F component | 1.02 | 1.20 | 1.80 | 0.60 | 2.40 | 1.02 | 1.20 |

Abbreviation:
Ex. stands for Example.

<Measurement of Solid Concentration>

The measurement was carried out in accordance with JIS K 5601-1-2. Note that drying was carried out at 150° C. for 1 hour.

The following description explains <1> through <7> in Table 1.

<1> Trade name of glycidyl amine epoxy resin manufactured by Japan Epoxy Resins Co., Ltd.

<2> Trade name of cresol novolac polyfunctional epoxy resin manufactured by DIC Corporation <3> NK ester A-9300, trade name manufactured by Shin-Nakamura Chemical Co., Ltd. (ethoxylated triacrylate isocyanurate)<

4> NK ester BPE-1300, trade name manufactured by Shin-Nakamura Chemical Co., Ltd. (bisphenol-A EO-modified diacrylate) Molecular weight: 1684

<5> Trade name of a photopolymerization initiator manufactured by Chiba Specialty Chemicals Co., Ltd.

<6> Trade name of a phosphazene compound (phosphorus flame retarder) manufactured by Otsuka Chemical Co., Ltd.

<7> Trade name of a silica particle manufactured by Nippon Aerosil Co., Ltd.

<Preparation of Cured Film on Polyimide Film>

The photosensitive resin composition was casted and applied, by use of a Baker's applicator, to an area of 100 mm×100 mm of a polyimide film (75NPI, trade name manufactured by Kaneka Corporation) having a thickness of 75 μm so that the photosensitive resin composition finally had a thickness of 25 μm. A resultant film was dried at 80° C. for 20 minutes. Thereafter, a negative photolithographic mask in which line width/space width of an area of 50 mm×50 mm is 100 μm/100 μm was provided on the film, and the film was subjected to light exposure by being irradiated with ultraviolet light in an accumulated amount of 300 mJ/cm². Subsequently, the photosensitive resin composition is subjected to spray development with a 1.0 wt % sodium carbonate aqueous solution heated to 30° C. at a discharge pressure of 1.0 kgf/mm² for 60 seconds. After being sufficiently rinsed with pure water after the spray development, the photosensitive resin composition was thermally cured in an oven at 160° C. for 90 minutes. In this way, a cured film of the photosensitive resin composition was prepared.

<Evaluation of Cured Film>

The obtained cured film was evaluated in terms of the following items. Table 2 shows a result of the evaluation.

(i) Photosensitivity

Photosensitivity of the photosensitive resin composition was evaluated by observing a surface of the cured film obtained in the above <Preparation of Cured film on Polyimide Film>. G (Good): A polyimide film surface had a clear photosensitive pattern having a line width/space width of 100/100 μm. There occurred no deformation of lines caused by delamination of a line portion, and there was no undissolved residue in a space portion.

E (Enough): A polyimide film surface had a clear photosensitive pattern having a line width/space width of 100/100 μm. There occurred deformation of lines caused by delamination of a line portion, and there was no undissolved residue in a space portion.

P (Poor): A polyimide film surface had no clear photosensitive pattern having a line width/space width of 100/100 μm. A line portion had been delaminated, and there was an undissolved residue in a space portion.

(ii) Solvent Resistance

Solvent resistance of the cured film obtained in the above <Preparation of Cured Film on Polyimide Film> was evaluated. The evaluation was carried out by a method in which the cured film was immersed, for 15 minutes, in methyl ethyl ketone having a temperature of 25° C. and then air-dried, and a film surface was observed.

G (Good): No abnormality occurred in a coated film.

P (Poor): Abnormality such as a blistering, delamination, and/or the like occurred in a coated film.

(iii) Bending Resistance

As in the case of the above <Preparation of Cured Film on Polyimide Film>, a cured film laminated film of a photosensitive resin composition was prepared on a surface of a polyimide film (Apical 25NPI manufactured by Kaneka Corporation) having a thickness of 25 μm. Note, however, that without using a negative type mask, an entire surface of the photosensitive resin composition was subjected to light exposure by being irradiated with ultraviolet light in an accumulated amount of 300 mJ/cm². The cured film laminated film was cut out into strips having a size of 30 mm×10 mm. Each of the strips was bent at 180° 10 times at a point of 15 mm from its end, and the coated film was visually observed to check whether or not there was cracking.

G (Good): No cracking appeared in a cured film.

E (Enough): Slight cracking appeared in a cured film.

P (Poor) indicates that cracking appeared in a cured film.

(iv) Insulation Reliability

A comb-shaped pattern in which line width/space width is 100 μm/100 μm was prepared on a flexible copper clad laminate (in which copper foil has a thickness of 12 μm, a polyimide film is Apical 25NPI manufactured by Kaneka Corporation, and the copper foil is adhered by use of a polyimide adhesive). The flexible copper clad laminate was (i) immersed in a 10 vol % sulfuric acid aqueous solution for one minute, (ii) rinsed with pure water, and (iii) subjected to a surface treatment in which the copper foil was surface-treated. Then, a cured film of a photosensitive resin composition was prepared on the comb-shaped pattern as in the case of the above <Preparation of Cured Film on Polyimide Film>. In this way, a test piece was prepared. In an environmental test device at 85° C. and at a relative humidity of 85%, a direct current of 100 V was applied to both ends of the test piece, and a change in insulation resistance values, migration, and the like were observed.

G (Good): 1000 hours after the start of the test, an insulation resistance value was not less than $10^8$ ohms, and no migration, and dendrite formation, or the like was observed.

P (Poor): 1000 hours after the start of the test, migration, dendrite formation, or the like was observed.

(v) Solder Heat Resistance

As in the case of the above <Preparation of Cured Film on Polyimide Film>, a cured film laminated film of a photosensitive resin composition was prepared on a surface of a polyimide film (Apical 75NPI manufactured by Kaneka Corporation) having a thickness of 75 μm. Note, however, that without using a negative type mask, an entire surface of the photosensitive resin composition was subjected to light exposure by being irradiated with ultraviolet light in an accumulated amount of 300 mJ/cm².

The cured film was floated on a solder bath which was completely melted at 260° C. so that a surface of the cured film to which surface a cured film of a photosensitive resin composition was applied came into contact with the solder bath. Ten seconds later, the cured film was pulled up. This operation was carried out 3 times. Then, an adhesive strength of the cured film was evaluated by a cross-cut tape method in accordance with JIS K5400.

G (Good): No delamination was observed in a cured film in the cross-cut tape method.

E (Enough): Not less than 95% of grids remained in a cured film.

P (Poor): Less than 80% of grids remained in a cured film.

(vi) Warpage

As in the case of the above <Preparation of Cured Film on Polyimide Film>, a cured film laminated film of a photosensitive resin composition was prepared on a surface of a polyimide film (Apical 25NPI manufactured by Kaneka Corporation) having a thickness of 25 μm. Note, however, that without using a negative type mask, an entire surface of the photosensitive resin composition was subjected to light exposure by being irradiated with ultraviolet light in an accumulated amount of 300 mJ/cm$^2$.

Figure 2:
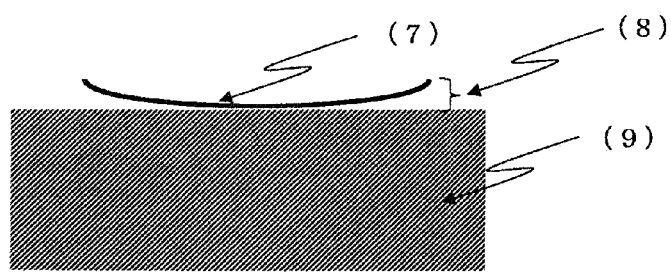
FIG. 2
Figure 3:
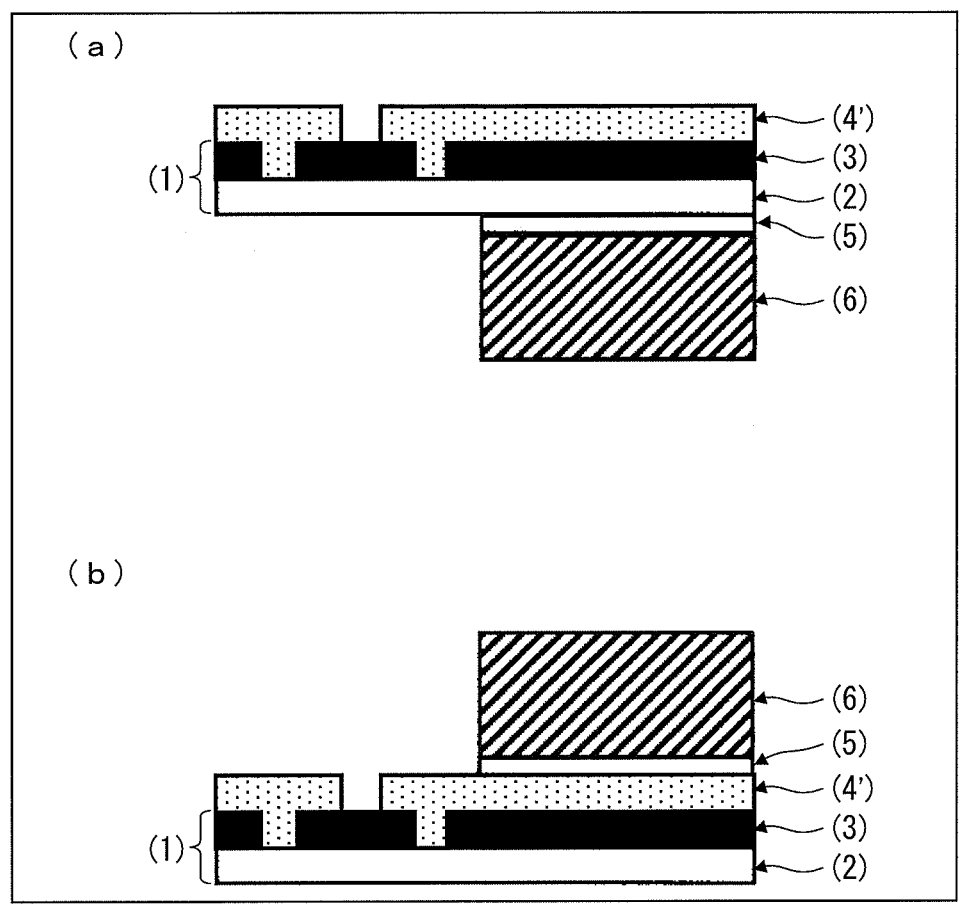
FIG 3

The cured film was cut into a film having an area of 50 mm×50 mm, and the film was placed on a flat table so that its coated film faced upward. Thus, how much an end portion of the film was warped was measured. FIG. 2 schematically shows a measured portion of the film. As a polyimide film surface is warped in a smaller amount, stress exerted on a surface of a printed wiring board becomes smaller. Accordingly, the printed wiring board is warped in a smaller amount. It is therefore preferable that an amount of warpage be not more than 5 mm.

(vii) Flame Retardancy

In accordance with UL 94, which is a standard for a flame retardancy test of plastic materials, a flame retardancy test was carried out as below. As in the case of the above <Preparation of Cured Film on Polyimide Film>, a cured film laminated film of a photosensitive resin composition was prepared on both sides of a polyimide film (Apical 25NPI manufactured by Kaneka Corporation) having a thickness of 25 μm. Note, however, that without using a negative type mask, an entire surface of the photosensitive resin composition was subjected to light exposure by being irradiated with ultraviolet light in an accumulated amount of 300 mJ/cm$^2$. A sample thus prepared was cut out so as to have a width of 50 mm, a length of 200 mm, and a thickness of 75 μm (including a thickness of the polyimide film). A marked line was provided to the sample at a point of 125 mm. The sample was then rolled up into a tube having a diameter of approximately 13 mm. A PI tape was applied to the sample so that no gap was found in an upper part of the sample and in an overlapping portion of the sample which overlapping portion is above the marked line (a portion from the upper part to a point of 75 mm). Twenty tubes for the flame retardancy test were thus prepared. Among the 20 tubes, 10 tubes were treated (1) at 23° C. and at a relative humidity of 50% for 48 hours. The remaining 10 tubes were treated (2) at 70° C. for 168 hours, and then cooled, for not less than 4 hours, in a desiccator containing anhydrous calcium chloride. The upper part of the sample was fixed by use of a clamp so that the sample was fixed upright. Then, flames of a burner were brought close to a lower part of the sample for 10 seconds so as to ignite the lower part. The flames of the burner were moved away from the lower part after 10 seconds, and it was measured in how many seconds the flames would be extinguished or the sample would stop burning.

G (Good): Under each of the above conditions ((1) and (2)), flames or burning stopped and then self-extinguishing occurred within 5 seconds on average (an average of 10 tubes), and within up to 10 seconds, after flames of a burner were moved away from a sample.

P (Poor): There existed at least one sample flames on which were not extinguished within 10 seconds, or flames rose to a clamp in an upper part of a sample and burnt.

(viii) Reflow Heat Resistance (Reflow Resistance)

As in the case of the above <Preparation of Cured Film on Polyimide Film>, a cured film laminated film of a photosensitive resin composition was prepared on a surface (i.e., a copper foil surface) of a test piece on which surface copper foil remains. The test piece was obtained by etching out copper foil on one side of a flexible double-sided copper-clad laminate (in which copper foil has a thickness of 12 μm, a polyimide film is Apical 25NPI manufactured by Kaneka Corporation, and the copper foil is adhered by use of a polyimide adhesive). Note, however, that without using a negative type mask, an entire surface of the photosensitive resin composition was subjected to light exposure by being irradiated with ultraviolet light in an accumulated amount of 300 mJ/cm$^2$. Further, a laminate 1 was prepared by using a heat roll laminator at 185° C. to temporarily pressure-bond a thermosetting adhesive (Pyralux LF0100, manufactured by DuPont) to the polyimide film (APICAL 125NPI, manufactured by Kaneka Corporation). Thereafter, a laminate 2 was prepared by pressure-bonding (i) a surface of the photosensitive resin composition of the prepared cured film laminated film of a photosensitive resin composition and (ii) the bonding material surface of the laminate 1 by hot pressing at 165° C. for 90 minutes. Appearance of the laminate 2 which had been subjected to a reflow process under a reflow condition of 260° C. (peak top of 260° C.×20 seconds was observed.

G (Good): There was no change in appearance before and after the test.

E (Enough): A blistering occurred at any of laminate interfaces in a part of the laminate after the test.

P (Poor): A blistering occurred at any of laminate interfaces in an entire surface of the laminate after the test.

(ix) Peel Strength

As in the case of the above <Preparation of Cured Film on Polyimide Film>, a laminate-1 was prepared by laminating a photosensitive resin composition cured film on a surface of a test piece on which surface copper foil has not been etched out. The test piece was obtained by etching out copper foil on one side of a flexible double-sided copper-clad laminate (in which copper foil has a thickness of 12 μm, a polyimide film is Apical 25NPI manufactured by Kaneka Corporation, and the copper foil is adhered by use of a polyimide adhesive) having a width of 5 cm and a length of 11 cm. Subsequently, a laminate-2 was prepared by using a heat roll laminator at 185° C. to temporarily pressure-bond the bonding material (thermosetting adhesive, Pyralux LF0100 (trade name) manufactured by DuPont) to an entire surface of the stiffener (polyimide film, APICAL 125NPI (trade name) manufactured by Kaneka Corporation) having a width of 5 cm and a length of 10 cm. Thereafter, a laminate-3 was prepared by causing a surface of the photosensitive resin composition cured film of the laminate-1 and the bonding material surface of the laminate-2 to overlap each other so that the laminate-1 protruded from the laminate-2 by a length of 1 cm, and the laminate-1 and the laminate-2 were pressure-bonded by hot pressing at a pressure of 2.5 MPa at 165° C. for 90 minutes. Next, by using a hand roller, a double-sided tape was pressure-bonded to an entire surface of one side of a double-sided copper foil glass epoxy substrate having a width of 5 cm, a length of 10 cm, and a thickness of 0.4 mm, so as to prepare a base material for peel strength measurement which was constituted by the double-sided copper foil glass epoxy substrate and the double-sided tape. Then, a test piece for peel strength measurement which was constituted by the laminate-3 and the base material for peel strength measurement was prepared by causing the stiffener surface of the laminate-3 and the double-sided tape surface of the base material for peel strength measurement to overlap with each other, and carrying out pressure-bonding by use of a hand roller. The test piece for peel strength measurement thus obtained was cut to cut lines at intervals of 1 cm in width and 10 cm in length in such a way that an edge of a cutter reaches (A) the stiffener from the laminate-1 surface. A part of the laminate-1 which part protrudes from the test piece for peel strength measurement by 1 cm is caught in a zipper of a tensile test machine (Strograph, manufactured by TOYO SEIKI SEISAKU-SHO, LTD.), so as to measure a peel strength under conditions of a tensile direction of 90° with respect to a length direction, a tensile speed of 10 mm/min, and a room temperature of 23° C.

TABLE 2

| Evaluation item | Ex. 1 | Ex. 2 | Ex. 3 | Ex. 4 | Ex. 5 | Ex. 6 | Ex. 7 | Comp. Ex. 1 | Comp. Ex. 2 |
|---|---|---|---|---|---|---|---|---|---|
| Photosensitivity | G | G | G | G | G | G | G | G | G |
| Solvent resistance | G | G | G | G | G | G | G | G | G |
| Bending resistance | G | G | G | G | G | G | G | G | G |
| Insulation reliability | G | G | G | G | G | G | G | G | G |
| Solder heat resistance | G | G | G | G | G | G | G | G | G |
| Warpage (mm) | 1.0 | 1.5 | 1.8 | 1.0 | 2.0 | 1.0 | 2.0 | 1.0 | 1.0 |
| Flame retardancy | G | G | G | G | G | G | G | G | G |
| Reflow heat resistance | G | G | G | E | G | G | G | P | P |
| Peel strength (N/cm) | 3.0 | 8.0 | 10.0 | 1.0 | 12.0 | 3.0 | 4.0 | 0.2 | 0.5 |

Abbreviation:
Ex. stands for Example.
Comp. Ex. Stands for Comparative Example.

Comparative Example 1

A photosensitive resin composition solution was prepared by mixing:

70 parts by weight of (A) carboxyl group-containing Polymer obtained by copolymerizing methacrylic acid, methyl methacrylate, acrylic acid methyl, and styrene in a weight ratio of 16:35:39:10 (a weight average molecular weight is 90,000, an acid value is 104 mg/g, and Tg is 49.9° C.) (solid content);

30 parts by weight (solid content) of (B) photopolymerizable compound which has an ethylenic unsaturated bond and contains no halogen atom: a urethane bond-containing monomer (UF-TCB-50 (trade name) manufactured by Kyoei Chemical Co., Ltd.);

5 parts by weight of (C) photopolymerization initiator: Irgacure 369 (trade name manufactured by Chiba-geigy Co., Ltd);

20 parts by weight of (D) phenoxyphosphazene compound: SPB-100 (trade name manufactured by Otsuka Chemical Co., Ltd);

5 parts by weight of (E) phosphoric ester compound: CR-747 (trade name manufactured by Daihachi chemical industry Co., Ltd);

50 parts by weight of (F) halogen flame retardant: Bromine-containing acrylate which has one ethylenic unsaturated bond (BR-31 manufactured by Dai-ichi kogyo seiyaku Co., Ltd.);

20 parts by weight of bromine-containing acrylate which has two ethylenic unsaturated bonds (GX6094 (trade name) manufactured by Dai-ichi kogyo seiyaku Co., Ltd.); and 20 parts by weight of (solvent) methylethyl ketone, and physical properties were evaluated as in the case of Example 1. Table 2 shows a result of the evaluation.

Comparative Example 2

A photosensitive thermosetting resin composition was prepared by mixing and kneading, by using three roll mills, 80 parts by mass of Kayarad ZFR1122 (trade name manufactured by Nippon Kayaku Co., Ltd.) as an epoxy acrylate compound; 20 parts by mass of Kayarad DPHA (trade name manufactured by Nippon Kayaku Co., Ltd.,) which is a photopolymerizable monomer and serves as a diluent; 7 parts by mass of Irgacure 369 (trade name manufactured by Chiba-geigy Co., Ltd.; a photopolymerization initiator 1) and 3 parts by mass of Kayacure DETXS (trade name manufactured by Nippon Kayaku Co., Ltd.; a photopolymerization initiator 2) each serving as a photopolymerization initiator; 20 parts by mass of epoxy resin (having a phosphorous content of 2.0% and an epoxy equivalence of 300) as a thermosetting component; 2 parts by mass of an imidazole polymerization catalyst (2E4MZ (trade name) manufactured by Shikoku Chemicals Corporation) and 2 parts by mass of melamine each serving as a curing agent; 10 parts by mass of barium sulfate (B-30 (trade name) manufactured by Sakai Chemical Industry Co., Ltd.); 2 parts by mass of phthalocyanine blue; 5 parts by mass of fine silica (Aerosil R972 (trade name) manufactured by Nippon Aerosil Co., Ltd.); 5 parts by mass of phenoxy phosphazene oligomer (whose melting point is 110° C.); and 10 parts by mass of polyimide resin. The mixed solution was completely defoamed by use of a defoaming device, and physical properties of the mixed solution were evaluated as in the case of Example 1. Table 2 shows a result of the evaluation. Note that the polyimide resin used here was obtained by the following synthesis method. Note also that the epoxy resin used here as a thermosetting component was obtained by a synthesis method described after the following synthesis method.

(Synthesis of Polyimide Resin)

4951 g of diethylene glycol monoethylether acetate (hereinafter referred to as "EDGA"); 2760 g (12 moles as an isocyanate group) of polyisocyanate (T1890/100 (trade name) manufactured by Daicel-Huels Ltd.; having an isocyanate group content of 18.2% and an isocyanurate ring-containing triisocyanate content of 85%, hereinafter referred to as "IPDI-N") having an isocyanurate ring derived from isophorone diisocyanate; 2191 g (2 moles as a hydroxyl group) of polytail HA (trade name manufactured by Mitsubishi Chemical Corporation; liquid hydrogenated polybutadiene having a hydroxyl group at both ends [which has a linear hydrocarbon structure whose number average molecular weight is 2100], hydroxyl value: 51.2 mg KOH/g) were poured into a 20-liter flask provided with a stirrer, a thermometer, and a condenser. A resultant mixture was heated to 80° C.

under stirring with attention paid to generation of heat. Thereafter, the mixture was reacted for 3 hours. Subsequently, 1536 g of EDGA and 1536 g (8 moles) of trimellitic anhydride (hereinafter referred to as "TMA") were further added to the flask, and a resultant mixture was heated to 160° C. Thereafter, the mixture was reacted for 4 hours. The reaction progressed concurrently with foaming. The mixture became a clear light brown liquid within the system. In this way, a solution of polyimide resin was obtained.

(Synthesis of Epoxy Resin)

481.7 parts by mass of YDPN-638 (trade name manufactured by Tohto Kasei Co., Ltd.,; phenol novolac epoxy resin, epoxy equivalent: 180.7) as a non-halogen epoxy resin; 518.3 parts by mass of HCA (manufactured by SANKO Co., Ltd., and having a phosphorus content of 14.4%) as a phosphorus-containing compound; and 1.04 parts by mass of triphenylphosphine (manufactured by Hokko Chemical Industry Co., Ltd.) as a catalyst were poured into a four-necked glass separable flask provided with a stirring device, a thermometer, a cooling pipe, and an nitrogen gas inlet device. A resultant mixture was stirred for 8 hours at an ordinary pressure and at a reaction temperature maintained between 160° C. and 190° C. Then, 993 parts by mass of solid phosphorus-containing epoxy resin was obtained, the solid phosphorus-containing epoxy resin having an epoxy equivalence of 300, a softening point of 130° C., and a phosphorus content of 2.0%.

(2) Experiment 2

Synthesis Example 2

<(i1) Synthesis of Resin Containing No Unsaturated Double Bond in Molecule and Containing Urethane Bond in Molecule>

17.5 g of 1,2-bis(2-methoxyethoxy)ethane as a polymerization solvent was poured into a separable flask provided with a stirring device, a thermometer, a dropping funnel, a reflux tube, and a nitrogen inlet tube. Subsequently, 20.6 g of norbornene diisocyanate (molecular weight: 206.4 g) was poured into the separable flask, and a resultant solution was heated to 80° C. so as to be dissolved. To the resultant solution, a solution was added over 1 hour, the solution obtained by dissolving, in 50.0 g of 1,2-bis(2-methoxyethoxy)ethane, 50.0 g of polycarbonate diol (PCDL T5652 (trade name) manufactured by Asahi Kasei Corp., having an average molecular weight of 2000) and 8.1 g of dimethylol butanoic acid (molecular weight: 148.2 g). Then, a resultant solution was refluxed by heating for 5 hours, so as to obtain an intermediate B. Thereafter, 1 g of methanol was added to the intermediate B, and the intermediate B was stirred for 5 hours. Then, a solution was obtained, the solution containing 50 wt % of (I-1) a resin which contains no unsaturated double bond in its molecule having a weight average molecular weight of 10,000 and contains a urethane bond(s) in its molecule.

Synthesis Example 3

<(i2) Synthesis of Resin Containing Unsaturated Double Bond(s) in Molecule and Containing Urethane Bond in Molecule>

364.4 g of an epoxy compound (Epikote 828 manufactured by Japan Epoxy Resins Co., Ltd, bifunctional bisphenol-A epoxy resin, epoxy equivalent: 182.2 g/equivalence), 144.1 g of acrylic acid (molecular weight: 72.06), 0.2 g of 2-methyl hydroquinone as a polymerization inhibitor, and 1.5 g of triphenylphosphine as a reaction catalyst were poured into a 2-liter reaction container provided with a stirrer, a thermometer, a dropping funnel, a reflux tube, and a nitrogen inlet tube. A resultant mixture was reacted until a reaction solution had an acid value of not more than 0.5 mg KOH/g at 98° C. In this way, an epoxy carboxylate compound (theoretical molecular weight: 508.5) was obtained.

Subsequently, 646.1 g of 1,2-bis(2-methoxyethoxy)ethane as a reaction solvent, 261.0 g of 2,2-bis(dimethylol)-propionate (molecular weight: 134.16), 30.2 g of polycarbonate diol (PCDL T5651 (trade name) manufactured by Asahi Kasei Chemicals Corporation, acid value: 111.4 mg KOH/g, molecular weight: 1007.4), 0.9 g of 2-methyl hydroquinone as a thermal polymerization inhibitor were added to the reaction solution, and a resultant solution was increased in temperature to 60° C. To the resultant solution, 375.4 g of diphenyl methane 4,4'-diisocyanate (molecular weight: 250.26) was gradually dropped over 30 minutes so that a reaction temperature did not exceed 65° C. After the dropping was finished, the solution was increased in temperature to 80° C., and stirred by heating for 6 hours, by an infrared absorption spectrum measuring method, until no absorption was found in a vicinity of 2250 cm$^{-1}$. Then, a solution (solid content acid value: 90 mg·KOH/mol) was obtained, the solution containing 65 wt % of (I-2) a resin which contains an unsaturated double bond(s) in its molecule and contains a urethane bond(s) in its molecule.

<Measurement of Solid Content Concentration>

Measurement was carried out as in the case of Experiment 1.

<Measurement of Acid Value>

Measurement was carried out as the case of Experiment 1.

Synthesis Example 4

<Synthesis of Resin Containing No Urethane Bond in Molecule and Containing Unsaturated Double Bond(s) in Molecule>

220 g of cresol novolac epoxy resin (EOCN-1045 (trade name) manufactured by Nippon Kayaku Co., Ltd., epoxy equivalent: 220 g/equivalence), 72.1 g of acrylic acid (molecular weight: 72.06 g), 125.2 g of 1,2-bis(2-methoxyethoxy)ethane as a polymerization solvent, 0.21 g of 2-methyl hydroquinone as a thermal polymerization inhibitor, and 1.25 g of triphenylphosphine as a reaction catalyst were poured into a 1-liter separable flask provided with a stirrer, a thermometer, a dropping funnel, a reflux tube, and a nitrogen inlet tube. A resultant solution was reacted at 98° C. for 24 hours. Subsequently, to the reaction solution, 105.7 g of tetrahydro phthalic anhydride (molecular weight: 153.2 g), 45.3 g of 1,2-bis(2-methoxyethoxy)ethane, and 0.28 g of 2-methyl hydroquinone were added, and a resultant solution was reacted at 95° C. for 4 hours. Then, a solution was obtained, the solution (i) containing (ii1) a resin which contains no urethane bond in its molecule and contains an unsaturated double bond(s) in its molecule, (ii) having a solid content concentration of 70% and a solid content acid value of 98 mg·KOH/g.

<Preparation of Photosensitive Resin Composition>

A photosensitive resin composition was prepared by adding the resin obtained in Synthesis Examples, (H) a photopolymerization initiator, and other components. Table 3 shows (i) amounts in which the above raw materials of the photosensitive resin composition are mixed in a resin solid content and (ii) kinds of the raw materials. Note that 1,2-bis(2-methoxyethoxy)ethane, which is a solvent shown in Table 3, indicates a total amount of a solvent including a solvent and the like which are contained in, for example, the resin solution synthesized in Synthesis Examples. A mixed solution was completely defoamed in a defoaming device, and the following evaluation was carried out.

shown in Table 3 are referred to as Examples 8, 9, 10, 11, and 12, and Comparative Example 3, respectively.

TABLE 3

| Photosensitive resin composition | | 1 | 2 | 3 | 4 | 5 | 6 |
|---|---|---|---|---|---|---|---|
| | | | | | Unit: parts by weight | | |
| I component | I-1 | 12.0 | 30.0 | 12.0 | 30.0 | — | — |
| | I-2 | — | — | 48.0 | 30.0 | 60.0 | — |
| Comparative component | i1 | 48.0 | 30.0 | — | — | — | 60.0 |
| H component | Irgacure 369[1] | 3.0 | 3.0 | 3.0 | 3.0 | 3.0 | 3.0 |
| Other components | YX-4000[2] | 10.0 | 10.0 | 10.0 | 10.0 | 10.0 | 10.0 |
| | 1,2-bis(2-methoxyethoxy)ethane | 48.0 | 48.0 | 48.0 | 48.0 | 48.0 | 48.0 |

The following description explains <1> and <2> of Table 3.
<1> Trade name of photopolymerization initiator manufactured by BASF Japan Ltd.
<2> Trade name of bisphenol-A epoxy resin manufactured by Japan Epoxy Resins Co., Ltd.

Photosensitivity and the like of a photosensitive resin composition were evaluated. For an evaluation method, <Preparation of Cured Film on Polyimide Film> and <Evaluation of Cured Film> in Experiment 1 are to be referred to. Table 4 shows a result of the evaluation. Standards for the evaluation (G (Good), E (Enough), P (Poor)) which are shown in Table 4 are identical with those of Experiment 1.

TABLE 4

| | Photosensitive resin composition | 1 | 2 | 3 | 4 | 5 | 6 |
|---|---|---|---|---|---|---|---|
| Evaluation item | Photosensitivity | G | G | E | G | G | G |
| | Solvent resistance | G | G | G | G | G | G |
| | Bending resistance | E | G | G | G | E | P |
| | Insulation reliability | G | G | G | G | G | G |
| | Solder heat resistance | G | G | G | G | G | G |

Examples 8 through 12 and Comparative Example 3

<Preparation of Stiffener-integrated Flexible Printed Circuit Board>

As in the case of the above <Preparation of Cured Film on Polyimide Film>, a cured film of a photosensitive resin composition was formed on a copper foil surface of a flexible double-sided copper-clad laminate (in which copper foil has a thickness of 12 μm, a polyimide film is Apical 25NPI manufactured by Kaneka Corporation, and the copper foil is adhered by use of a polyimide adhesive) on one side of which copper foil has been etched out. A cured film laminated film of a photosensitive resin composition was thus prepared on a copper foil surface. Note, however, that without using a negative type mask, an entire surface of the photosensitive resin composition was subjected to light exposure by being irradiated with ultraviolet light in an accumulated amount of 300 mJ/cm². Further, a laminate 1 was prepared by using a heat roll laminator at 185° C. to temporarily pressure-bond a thermosetting adhesive (Pyralux LF0100, manufactured by DuPont) to the polyimide film (APICAL 125NPI, manufactured by Kaneka Corporation). Thereafter, a stiffener-integrated flexible printed circuit was prepared by pressure-bonding (i) a surface of the photosensitive resin composition of the prepared cured film laminated film of a photosensitive resin composition and (ii) the bonding material surface of the laminate 1 by hot pressing at 165° C. for 90 minutes. Stiffener-integrated flexible printed circuit boards which were prepared by using photosensitive resin compositions 1, 2, 3, 4, 5, and 6

<Evaluation of Stiffener-integrated Flexible Printed Circuit Board>

The prepared stiffener-integrated flexible printed circuit boards were evaluated in terms of the following items. Table 5 shows a result of the evaluation. Standards for the evaluation (G (Good), E (Enough), P (Poor)) which are shown in Table 5 are identical with those of Experiment 1.

(Adhesiveness)
Respective peel strengths of the prepared stiffener-integrated flexible printed circuit boards were measured. The measurement of the peel strengths was carried out as in the case of Experiment 1.

G (Good): A stiffener-integrated flexible printed circuit board had a peel strength of not less than 1 N/cm.
E (Enough): A stiffener-integrated flexible printed circuit board had a peel strength of less than 1 N/cm.
P (Poor): No peel strength could be obtained from a stiffener-integrated flexible printed circuit board.

(Reflow Heat Resistance and Warpage)
Evaluation of reflow heat resistance of each of the prepared stiffener-integrated flexible printed circuit boards was carried out as in the case of Experiment 1.

(viii) Warpage
Each of the prepared stiffener-integrated flexible printed circuit boards was processed so as to be 5 cm square, and it was measured how much four corners of the each of the stiffener-integrated flexible printed circuit boards were warped. FIG. 2 schematically shows how a warpage amount is measured.

G (Good): A stiffener-integrated flexible printed circuit board was warped in an amount of less than 10 mm on average at its four corners.
E (Enough): A stiffener-integrated flexible printed circuit board was warped in an amount of not less than 10 mm and less than 20 mm on average at its four corners.
P (Poor): A stiffener-integrated flexible printed circuit board was warped in an amount of not less than 20 mm on average at its four corners.

TABLE 5

| | | Ex. | | | | | Comp. Ex. |
|---|---|---|---|---|---|---|---|
| | | 8 | 9 | 10 | 11 | 12 | 3 |
| Photosensitive resin composition | | 1 | 2 | 3 | 4 | 5 | 6 |
| Evaluation item | Adhesiveness | E | G | G | G | G | P |
| | Reflow heat resistance | E | G | G | G | G | P |
| | Warpage | E | E | G | G | E | P |

Abbreviation:
Ex. stands for Example.
Comp. Ex. Stands for Comparative Example.

INDUSTRIAL APPLICABILITY

The present invention relates to a stiffener-integrated flexible printed circuit board in which a defect such as a blistering is not generated during a reflow process even though a stiffener is attached to a photosensitive resin composition, and to a method for manufacturing the stiffener-integrated flexible printed circuit board.

Therefore, the present invention is preferably usable in a flexible printed circuit board industry.

REFERENCE SIGNS LIST 1 (D) Flexible printed circuit board
2 Base material
3 Conductor
4 (C) Cured film obtained by curing a photosensitive resin composition
4' Non-photosensitive cover lay film
5 (B) Bonding material
6 (A) Stiffener
7 Photosensitive resin composition-laminated polyimide film (Prepared stiffener-integrated flexible printed circuit board)
8 Warpage amount
9 Smooth stand

The invention claimed is:

1. A stiffener-integrated flexible printed circuit board having a structure in which (A) a stiffener, (B) a bonding material, (C) a cured film obtained by curing a photosensitive resin composition, and (D) a flexible printed circuit board are laminated in this order.

2. The stiffener-integrated flexible printed circuit board as set forth in claim 1, wherein the stiffener-integrated flexible printed circuit board has a peel strength of not less than 1 N/cm between (B) the bonding material and (C) the cured film obtained by curing a photosensitive resin composition.

3. The stiffener-integrated flexible printed circuit board as set forth in claim 1, wherein (B) the bonding material is a thermosetting adhesive.

4. The stiffener-integrated flexible printed circuit board as set forth in claim 1, wherein the photosensitive resin composition contains (E) a thermosetting resin containing a reactive group reactive with a carboxyl group and (F) a carboxyl group-containing resin.

5. The stiffener-integrated flexible printed circuit board as set forth in claim 4, wherein (E) the thermosetting resin containing a reactive group reactive with a carboxyl group is an epoxy resin containing an epoxy group as the reactive group.

6. The stiffener-integrated flexible printed circuit board as set forth in claim 4, wherein (F) the carboxyl group-containing resin is a carboxyl group-containing resin which contains substantially no photosensitive group in its molecule.

7. The stiffener-integrated flexible printed circuit board as set forth in claim 4, wherein the reactive group in (E) the thermosetting resin containing a reactive group reactive with a carboxyl group is 1.0 time to 1.8 times greater in mole than a carboxyl group of (F) the carboxyl group-containing resin.

8. The stiffener-integrated flexible printed circuit board as set forth in claim 1, wherein the photosensitive resin composition contains (G) an unsaturated double bond-containing resin and (H) a photopolymerization initiator.

9. The stiffener-integrated flexible printed circuit board as set forth in claim 1, wherein the photosensitive resin composition contains at least (I) a compound which contains a urethane bond(s).

10. The stiffener-integrated flexible printed circuit board as set forth in claim 9, wherein the photosensitive resin composition contains (i1) a resin which contains no unsaturated double bond in its molecule and contains a urethane bond(s) in its molecule.

11. The stiffener-integrated flexible printed circuit board as set forth in claim 9, wherein the photosensitive resin composition contains (i2) a resin which contains an unsaturated double bond(s) in its molecule and contains a urethane bond(s) in its molecule.

12. The stiffener-integrated flexible printed circuit board as set forth in claim 9, wherein the photosensitive resin composition contains (i1) a resin which contains no unsaturated double bond in its molecule and contains a urethane bond(s) in its molecule and (i2) a resin which contains an unsaturated double bond(s) in its molecule and contains a urethane bond(s) in its molecule.

13. The stiffener-integrated flexible printed circuit board as set forth in claim 9, wherein the photosensitive resin composition further contains (H) a photopolymerization initiator.

14. A method for manufacturing a stiffener-integrated flexible printed circuit board, comprising the step of:
laminating (B) a bonding material and (A) a stiffener in this order on (C) a cured film obtained by applying a photosensitive resin composition to (D) a flexible printed circuit board and curing the photosensitive resin composition.

15. The method as set forth in claim 14, wherein (B) the bonding material is a thermosetting adhesive.

16. The method as set forth in claim 14, wherein the photosensitive resin composition contains (E) a thermosetting resin containing a reactive group reactive with a carboxyl group, and (F) a carboxyl group-containing resin.

17. The method as set forth in claim 16, wherein (E) the thermosetting resin containing a reactive group reactive with a carboxyl group is an epoxy resin containing an epoxy group as the reactive group.

18. The method as set forth in claim 16, wherein (F) the carboxyl group-containing resin is a carboxyl group-containing resin which contains substantially no photosensitive group in its molecule.

19. The method as set forth in claim 16, wherein the reactive group in (E) the thermosetting resin containing a reactive group reactive with a carboxyl group is 1.0 time to 1.8 times greater in mole than a carboxyl group of (F) the carboxyl group-containing resin.

20. The method as set forth in claim 14, wherein the photosensitive resin composition contains (G) an unsaturated double bond-containing resin and (H) a photopolymerization initiator.

21. The method as set forth in claim 14, wherein the photosensitive resin composition contains at least (I) a compound which contains a urethane bond(s).

22. The method as set forth in claim 21, wherein the photosensitive resin composition contains (i1) a resin which contains no unsaturated double bond in its molecule and contains a urethane bond(s) in its molecule.

23. The method as set forth in claim 21, wherein the photosensitive resin composition contains (i2) a resin which contains an unsaturated double bond(s) in its molecule and contains a urethane bond(s) in its molecule.

24. The method as set forth in claim 21, wherein the photosensitive resin composition contains (i1) a resin which contains no unsaturated double bond in its molecule and contains a urethane bond(s) in its molecule and (i2) a resin which contains an unsaturated double bond(s) in its molecule and contains a urethane bond(s) in its molecule.

25. The method as set forth in claim 21, wherein the photosensitive resin composition further contains (H) a photopolymerization initiator.

\* \* \* \* \*